US012695515B2

(12) United States Patent　　　　(10) Patent No.:　US 12,695,515 B2
Maekawa　　　　　　　　　　　　　(45) Date of Patent:　　　Jul. 28, 2026

(54) OPTICAL RECEIVER

(71) Applicant: SUMITOMO ELECTRIC INDUSTRIES, LTD., Osaka (JP)

(72) Inventor: Kyohei Maekawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 362 days.

(21) Appl. No.: 18/684,239

(22) PCT Filed: Aug. 12, 2022

(86) PCT No.: PCT/JP2022/030769
§ 371 (c)(1),
(2) Date: Feb. 16, 2024

(87) PCT Pub. No.: WO2023/022110
PCT Pub. Date: Feb. 23, 2023

(65) Prior Publication Data
US 2025/0150176 A1　　May 8, 2025

(30) Foreign Application Priority Data

Aug. 20, 2021　　(JP) ................................. 2021-134911

(51) Int. Cl.
H04B 10/60　　　(2013.01)
H03F 3/08　　　(2006.01)
(Continued)

(52) U.S. Cl.
CPC ............... H04B 10/69 (2013.01); H03F 3/08 (2013.01); G02B 6/42 (2013.01); H04B 10/60 (2013.01)

(58) Field of Classification Search
CPC ........... H04B 10/69; H04B 10/60; H03F 3/08; G02B 6/42
(Continued)

(56) References Cited

U.S. PATENT DOCUMENTS 6,774,448 B1 * 8/2004 Lindemann ......... H10F 39/1536
257/466
7,439,599 B2 * 10/2008 Gao ...................... H10F 77/306
257/466
(Continued)

FOREIGN PATENT DOCUMENTS

JP　　H05-145112 A　　6/1993
JP　　2006-186167 A　　7/2006
(Continued)

OTHER PUBLICATIONS

International Search Report issued in Patent Application No. PCT/JP2022/030769 dated Nov. 8, 2022.

*Primary Examiner* — Dibson J Sanchez
(74) *Attorney, Agent, or Firm* — McDonald Hopkins LLC

(57)　　　　　ABSTRACT

An optical receiver includes a light receiving element, a carrier substrate, a dielectric layer, a base, a first conductive film, a second conductive film, a conductor, and a transimpedance. The first conductive film is provided between the light receiving element and the carrier substrate. The second conductive film is provided between the carrier substrate and the dielectric layer. A parasitic capacitance is present between the first wiring pattern of the first conductive film and the second conductive film. The conductor is electrically connected to the first wiring pattern and the second conductive film. The transimpedance has a first pad electrically connected to the first wiring pattern through a wire. An electrostatic capacitance between the second conductive film and the main surface of the base is larger than the parasitic capacitance. The inductance of the conductor is smaller than the inductance of the wire.

8 Claims, 26 Drawing Sheets

(51) Int. Cl.
    *H04B 10/69*        (2013.01)
    *G02B 6/42*         (2006.01)

(58) Field of Classification Search
    USPC ................................................. 398/202–214
    See application file for complete search history.

(56)               References Cited

U.S. PATENT DOCUMENTS

| | | | | |
|---|---|---|---|---|
| 10,598,875 | B2 * | 3/2020 | Xie | G02B 6/4219 |
| 2006/0034621 | A1 * | 2/2006 | Denoyer | H03F 3/087 |
| | | | | 398/208 |
| 2011/0044369 | A1 * | 2/2011 | Andry | H10F 39/107 |
| | | | | 257/E31.127 |
| 2011/0215225 | A1 * | 9/2011 | Takechi | G01J 1/44 |
| | | | | 250/208.2 |
| 2011/0311232 | A1 * | 12/2011 | Morita | H04B 10/6973 |
| | | | | 398/141 |
| 2012/0070121 | A1 * | 3/2012 | Ito | H03F 3/087 |
| | | | | 385/88 |
| 2012/0087678 | A1 * | 4/2012 | Earnshaw | G02B 6/12019 |
| | | | | 250/208.2 |
| 2012/0313210 | A1 * | 12/2012 | Miyatake | G01J 1/44 |
| | | | | 257/E31.124 |
| 2013/0101251 | A1 * | 4/2013 | Kawamura | G02B 6/12 |
| | | | | 174/266 |
| 2014/0064659 | A1 * | 3/2014 | Doerr | G02B 6/428 |
| | | | | 385/14 |
| 2014/0178079 | A1 * | 6/2014 | Yagisawa | G02B 6/4284 |
| | | | | 398/139 |
| 2014/0367557 | A1 * | 12/2014 | Ueno | H03F 3/08 |
| | | | | 250/214 A |
| 2015/0063832 | A1 * | 3/2015 | Park | G02B 6/4274 |
| | | | | 398/214 |
| 2015/0069220 | A1 * | 3/2015 | Yagisawa | H04B 10/60 |
| | | | | 250/214 A |
| 2015/0270814 | A1 * | 9/2015 | Ban | H03F 3/08 |
| | | | | 250/214 A |
| 2016/0245691 | A1 * | 8/2016 | Suzuki | G01J 1/44 |
| 2016/0349469 | A1 * | 12/2016 | Kase | B29C 39/02 |
| 2017/0075081 | A1 * | 3/2017 | Luk | H04B 10/697 |
| 2017/0212320 | A1 * | 7/2017 | Hara | G02B 6/4214 |
| 2017/0315313 | A1 * | 11/2017 | Cheng | G02B 6/4277 |
| 2017/0366277 | A1 * | 12/2017 | Ban | H04B 10/697 |
| 2018/0059339 | A1 * | 3/2018 | Gupta | G02B 6/425 |
| 2019/0020319 | A1 * | 1/2019 | Umezawa | H03F 3/195 |
| 2019/0123109 | A1 * | 4/2019 | Xie | G02B 27/0955 |
| 2019/0312652 | A1 * | 10/2019 | Shiraishi | H04B 10/693 |
| 2019/0319594 | A1 | 10/2019 | Nakayama et al. | |
| 2020/0241224 | A1 * | 7/2020 | Hara | G02B 6/4214 |
| 2021/0083780 | A1 * | 3/2021 | Nakayama | H05K 1/025 |
| 2021/0132306 | A1 * | 5/2021 | Krichevsky | G02B 6/4214 |
| 2021/0193638 | A1 * | 6/2021 | Ito | H03F 3/45475 |
| 2021/0384132 | A1 * | 12/2021 | Wang | H10F 39/107 |
| 2022/0113480 | A1 * | 4/2022 | Erickson | G02B 6/428 |

FOREIGN PATENT DOCUMENTS

| | | | |
|---|---|---|---|
| JP | 2007-274032 A | 10/2007 | |
| JP | 2019-186813 A | 10/2019 | |

\* cited by examiner

OPTICAL RECEIVER

TECHNICAL FIELD

The present disclosure relates to an optical receiver.

This application is based upon and claims the benefit of the priority from Japanese Patent Application No. 2021-134911 filed on Aug. 20, 2021, the entire contents of which are incorporated herein by reference.

BACKGROUND ART

Patent Literature 1 discloses an optical receiver that includes a light receiving element and a trans impedance amplifier (TIA). In this optical receiver, the electrical signal output from the light receiving element is amplified by the TIA and then output to the outside of the optical receiver.

CITATION LIST

Patent Literature

Patent Literature 1: Japanese Unexamined Patent Publication No. 2007-274032

SUMMARY OF INVENTION

An optical receiver according to an embodiment includes: a light receiving element; a carrier substrate on which the light receiving element is mounted; a dielectric layer on which the carrier substrate is mounted; a base which has a conductive main surface at a reference potential and on which the dielectric layer is mounted; a first conductive film having a first wiring pattern electrically connected to a cathode electrode of the light receiving element and provided between the light receiving element and the carrier substrate; a second conductive film provided between the carrier substrate and the dielectric layer, a parasitic capacitance being present between the first wiring pattern and the second conductive film; a conductor provided on the carrier substrate and electrically connected to the first wiring pattern and the second conductive film; and a transimpedance amplifier having a first pad electrically connected to the first wiring pattern through a wire and a second pad electrically connected to an anode electrode of the light receiving element. An electrostatic capacitance between the second conductive film and the main surface of the base is larger than the parasitic capacitance. The inductance of the conductor is smaller than the inductance of the wire.

DESCRIPTION OF EMBODIMENTS

Figure 1:
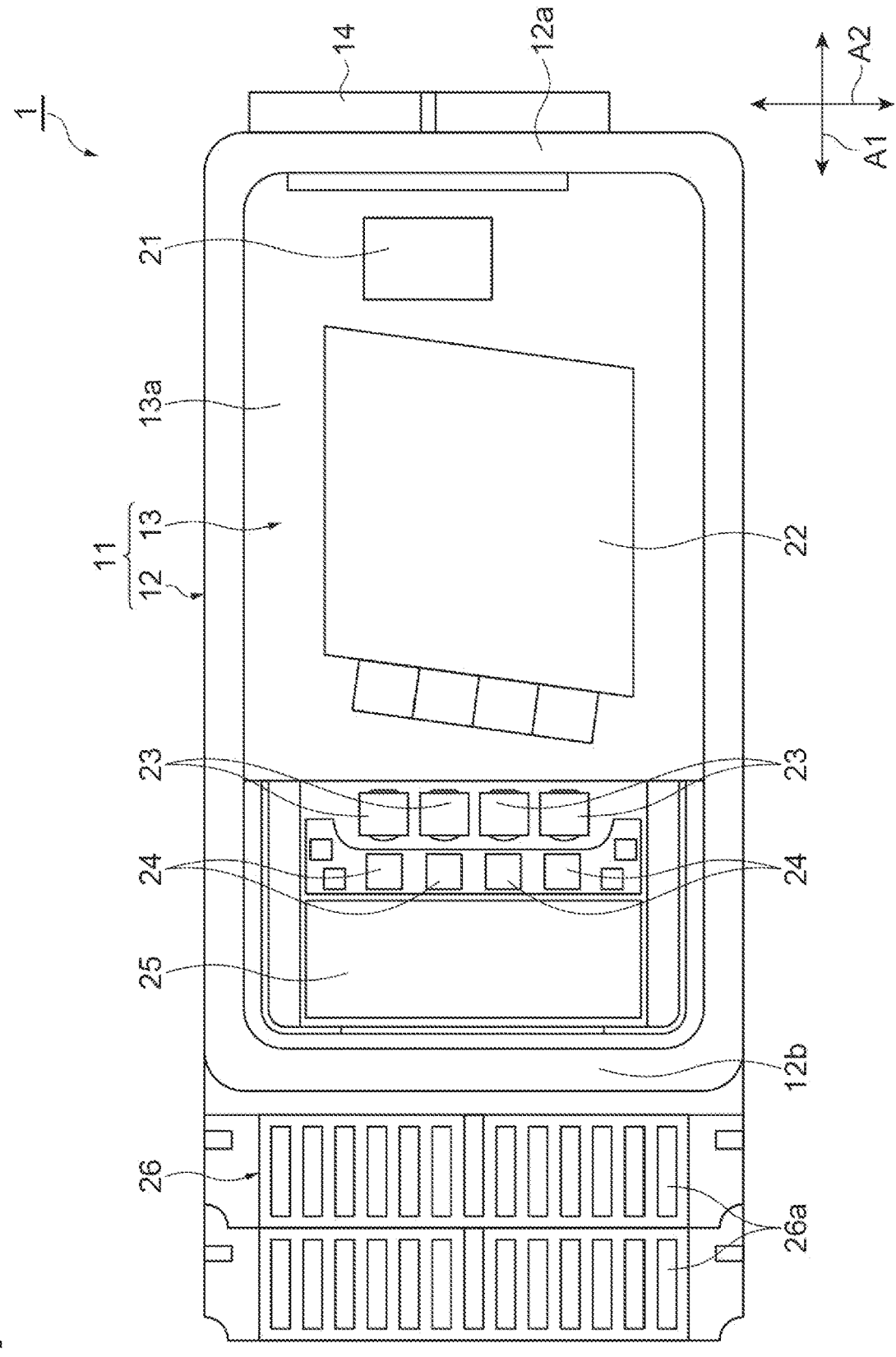
FIG. 1 is a plan view showing the internal structure of an optical receiver according to an embodiment.

Problems to be Solved by the Present Disclosure

In the optical receiver described in Patent Literature 1, the light receiving element and the TIA may be connected to each other through a wire. However, in such a configuration, the presence of a resonance frequency due to the inductance of the wire and the parasitic capacitance between the light receiving element and the TIA can be a problem. The frequency of the optical signal has been increasing due to the recent increase in the speed of optical communication and the like, and high frequency bands such as several tens of GHz or more are being used. In addition, it is also assumed that a high frequency band such as 100 GHz will be used. If there is a resonance frequency in such a high frequency band, a non-transmission band of the signal occurs, which may lead to degradation of signal waveforms and degradation of communication quality such as inter-channel crosstalk. In order to reduce the inductance between the light receiving element and the TIA, flip-chip bonding between the light receiving element and the TIA may be considered. In this case, however, a TIA having a dedicated pad for flip-chip bonding is required. Therefore, since a general-purpose TIA cannot be used, the manufacturing cost may increase.

Effect of the Present Disclosure

According to the optical receiver of the present disclosure, degradation of the communication quality can be suppressed by shifting the non-transmission band due to resonance while connecting the light receiving element and the transimpedance amplifier to each other through the wire.

Description of Embodiments of the Present Disclosure

First, embodiments of the present disclosure will be listed and described. An optical receiver according to an embodiment includes: a light receiving element; a carrier substrate on which the light receiving element is mounted; a dielectric layer on which the carrier substrate is mounted; a base which has a conductive main surface at a reference potential and on which the dielectric layer is mounted; a first conductive film having a first wiring pattern electrically connected to a cathode electrode of the light receiving element and provided between the light receiving element and the carrier substrate; a second conductive film provided between the carrier substrate and the dielectric layer, a parasitic capacitance being present between the first wiring pattern and the second conductive film; a conductor provided on the carrier substrate and electrically connected to the first wiring pattern and the second conductive film; and a transimpedance amplifier having a first pad electrically connected to the first wiring pattern through a wire and a second pad electrically connected to an anode electrode of the light receiving element. An electrostatic capacitance between the second conductive film and the main surface of the base is larger than the parasitic capacitance. The inductance of the conductor is smaller than the inductance of the wire.

In the optical receiver described above, the conductor electrically connected to the first wiring pattern of the first conductive film and the second conductive film is provided, and the inductance of the conductor is connected in parallel with the parasitic capacitance between the first wiring pattern and the second conductive film. The dielectric layer is provided between the second conductive film and the main surface of the base, and the electrostatic capacitance between the second conductive film and the main surface of the base is connected in series with the parasitic capacitance between the first conductive film and the second conductive film. In addition, the inductance of the conductor is smaller than the inductance of the wire, and the electrostatic capacitance between the second conductive film and the main surface of the base is larger than the parasitic capacitance. In such a configuration, since a resonance frequency due to the electrostatic capacitance and the inductance of the wire becomes dominant, the resonance frequency can be set low. Therefore, the resonance frequency can be shifted to the lower frequency side than the high frequency band such as several tens of GHz or 100 GHz. In other words, the non-transmission band due to resonance can be removed from the frequency band of the signal. As a result, it is possible to suppress degradation of the communication quality such as signal waveform degradation and inter-channel crosstalk.

In the optical receiver described above, the first conductive film may further have a second wiring pattern electrically connected to the anode electrode of the light receiving element and a third wiring pattern electrically connected to the cathode electrode of the light receiving element. The first wiring pattern and the third wiring pattern may be arranged on both sides of the second wiring pattern. The conductor may be electrically connected to the second conductive film and at least one of the first wiring pattern and the third wiring pattern. When the first wiring pattern and the third wiring pattern are arranged on both sides of the second wiring pattern as described above, magnetic fields generated by the current flowing through the light receiving element cancel each other out. Therefore, the magnetic fields are less likely to leak outside the first wiring pattern and the third wiring pattern. Therefore, it is possible to reduce crosstalk due to electromagnetic coupling to other wiring patterns.

In the optical receiver described above, the dielectric layer may have a front surface facing the second conductive film and a back surface facing the main surface of the base. A first metal film electrically connected to the second conductive film may be provided on the front surface of the dielectric layer. A second metal film electrically connected to the main surface of the base may be provided on the back surface of the dielectric layer. In this case, it becomes easy to bond the dielectric layer to the first metal film and the second metal film.

In the optical receiver described above, the first metal film, the dielectric layer, and the second metal film may form a chip capacitor. In this case, it is possible to easily realize a dielectric layer having a larger electrostatic capacitance than the parasitic capacitance between the first conductive film and the second conductive film.

In the optical receiver described above, the first metal film, the dielectric layer and the second metal film may form an MIM capacitor. In this case, it is possible to easily realize a dielectric layer having a larger electrostatic capacitance than the parasitic capacitance between the first conductive film and the second conductive film.

In the optical receiver described above, the dielectric layer may be an insulating film. In this case, it is possible to suitably realize a dielectric layer forming an MIM capacitor.

In the optical receiver described above, the dielectric layer may contain at least one of silicon nitride, silicon oxide, and silicon oxynitride. In this case, it is possible to easily form a dielectric layer forming an MIM capacitor.

In the optical receiver described above, the conductor may have a via that extends so as to penetrate the carrier substrate between the first wiring pattern and the second conductive film and is connected to the first wiring pattern and the second conductive film. The conductor may have a plurality of vias. The plurality of vias may be arranged at positions spaced apart from each other in plan view of the carrier substrate. In this case, it is possible to easily realize a conductor that is connected in parallel with the parasitic capacitance between the first wiring pattern and the second conductive film and has an inductance smaller than the inductance of the wire. In addition, the degree of freedom in wiring design is increased by adopting the configuration in which the first wiring pattern and the second conductive film are connected to each other through the vias.

In the optical receiver described above, the carrier substrate may have a front surface on which the first conductive film is provided, a back surface on which the second conductive film is provided, and a side surface connecting the front surface and the back surface to each other. The conductor may have a side surface conductive film provided on the side surface. The side surface conductive film may extend from the first wiring pattern to the second conductive film on the side surface and connect the first wiring pattern and the second conductive film to each other. In this case, it is possible to easily realize a conductor that is connected in parallel with the parasitic capacitance between the first wiring pattern and the second conductive film and has an inductance smaller than the inductance of the wire.

The optical receiver described above may further include a metal substrate provided between the dielectric layer and the base and electrically connected to the main surface of the base. In this case, even if the dielectric layer is formed thin in order to increase the electrostatic capacitance, the heights of the dielectric layer and the carrier on the metal substrate can be kept large due to the presence of the metal substrate. For this reason, the height difference between the carrier and the transimpedance amplifier can be kept small. As a result, it is possible to suppress the occurrence of a situation in which the wire connecting the first conductive film on the carrier and the first pad on the transimpedance amplifier to each other becomes long and accordingly, to suppress the connection loss between the light receiving element and the transimpedance amplifier.

The optical receiver described above may further include an insulating substrate provided between the dielectric layer and the base. The insulating substrate may have a front surface facing the dielectric layer and a back surface facing the main surface of the base. A back surface metal film electrically connected to the main surface of the base may be provided on the back surface of the insulating substrate. A front surface metal film electrically connected to the back surface metal film through a via penetrating an inside of the insulating substrate may be provided on the front surface of the insulating substrate. In this case, even if the dielectric layer is formed thin in order to increase the electrostatic capacitance, the heights of the dielectric layer and the carrier on the front surface metal film can be kept large due to the presence of the front surface metal film, the insulating substrate, and the back surface metal film. For this reason, the height difference between the carrier and the transimpedance amplifier can be kept small. As a result, it is possible to suppress the occurrence of a situation in which the wire connecting the first conductive film on the carrier and the first pad on the transimpedance amplifier to each other becomes long and accordingly, to suppress connection loss between the light receiving element and the transimpedance amplifier.

Details of Embodiments of the Present Disclosure

Specific examples of an optical receiver according to an embodiment will be described below with reference to the diagrams. In addition, the present disclosure is not limited to these examples but is defined by the claims, and is intended to include all modifications within the meaning and scope equivalent to the claims. In the description of the diagrams, the same elements are denoted by the same reference numerals, and the repeated description thereof will be appropriately omitted.

Figure 2:
FIG. 2 is a cross-sectional view showing the optical receiver in FIG. 1.

FIG. 1 is a plan view showing the internal structure of an optical receiver 1 according to the present embodiment. FIG. 2 is a cross-sectional view showing the optical receiver 1. In FIG. 1, the optical receiver 1 is shown with a lid of a package 11 removed. The optical receiver 1 is used as a ROSA (Receiver Optical Sub Assembly) of an optical transceiver. As shown in FIG. 1, the optical receiver 1 includes the package 11. The package 11 is a substantially rectangular parallelepiped hollow container. The package 11 has a sidewall 12 formed of metal and a bottom plate 13 formed of metal.

The bottom plate 13 is a rectangular flat plate. The bottom plate 13 extends along a direction A1 and a direction A2 crossing the direction A1. The bottom plate 13 includes a bottom surface 13a facing the inside of the package 11. At least the bottom surface 13a of the bottom plate 13 is conductive, and the bottom surface 13a is set to a reference potential. The bottom plate 13 can be formed of metal, such as copper molybdenum or copper tungsten. When the bottom plate 13 is formed of a material with good thermal conductivity, the heat dissipation of the bottom plate 13 can be enhanced.

The sidewall 12 has a rectangular frame shape, and is arranged along the peripheral edge of the bottom plate 13. The opening of the sidewall 12 on a side opposite to the bottom plate 13 is sealed with a lid. The sidewall 12 includes a sidewall portion 12a and a sidewall portion 12b aligned along the direction A1. An opening is formed in the sidewall portion 12a, and a bush 14 is provided in the opening. A receptacle of the optical receiver 1 is fixed to the sidewall portion 12a through the bush 14. For example, an optical window 15 (see FIG. 2) is arranged inside the bush 14. As shown in FIG. 2, signal light L emitted from the optical fiber connected to the receptacle is transmitted through the optical window 15 and taken into the package 11. The signal light L is, for example, multiplexed signal light having a plurality of signal light components.

As shown in FIGS. 1 and 2, the optical receiver 1 further includes an optical axis converter 21, an optical demultiplexer 22, a plurality of lenses 23, a plurality of light receiving elements 24, a TIA 25 (transimpedance amplifier), and a feedthrough 26. The optical axis converter 21, the optical demultiplexer 22, the plurality of lenses 23, the plurality of light receiving elements 24, and the TIA 25 are housed inside the package 11, and arranged side by side in this order from the sidewall portion 12a side in the direction A1. As shown in FIG. 2, the optical receiver 1 further includes a carrier 31 on which a plurality of light receiving elements 24 are mounted and a capacitor 32 on which the carrier 31 is mounted.

The feedthrough 26 is provided in the sidewall portion 12b to make an electrical connection with an external circuit. For example, the feedthrough 26 is configured by laminating a plurality of ceramic substrates, and is assembled so as to be fitted into an opening formed in the sidewall portion 12b. A plurality of terminals 26a for electrical connection with an external circuit are provided in the outer portion of the feedthrough 26 located outside the sidewall portion 12b. A plurality of terminals for electrical connection with the TIA 25 are provided in the inner portion of the feedthrough 26 located inside the sidewall portion 12b. The plurality of terminals in the inner portion of the sidewall portion 12b and the plurality of terminals 26a in the outer portion of the sidewall portion 12b are short-circuited with each other by wiring embedded inside the feedthrough 26.

As shown in FIG. 2, the optical axis converter 21 converts the optical axis of the signal light L input into the package 11 through the optical window 15. The optical axis converter 21 has a pair of mirrors 21a and 21b. The pair of mirrors 21a and 21b are arranged so as to face each other in a direction A3 crossing the directions A1 and A2. One mirror 21a of the pair of mirrors 21a and 21b is arranged at a position facing the optical window 15 in the direction A1. The mirror 21*a* reflects the signal light L input in the direction A1 from the optical window 15 toward the bottom plate 13 side in the direction A3. The other mirror 21*b* of the pair of mirrors 21*a* and 21*b* is arranged on the bottom plate 13, and reflects the signal light L input in the direction A3 from the mirror 21*a* toward the sidewall portion 12*b* side in the direction A1. In the following description, viewing from the direction A3 may be referred to as "in plan view".

The signal light L reflected by the mirror 21*b* is incident on the optical demultiplexer 22 in the direction A1. The optical demultiplexer 22 demultiplexes the signal light L, which is multiplexed signal light, into a plurality of signal light components having different wavelengths. The plurality of lenses 23 are arranged between the optical demultiplexer 22 and the plurality of light receiving elements 24 in the direction A1, and are aligned along the direction A2 (see FIG. 1). Each signal light component obtained by demultiplexing by the optical demultiplexer 22 is incident on each lens 23. Each lens 23 collects each demultiplexed signal light component and guides the demultiplexed signal light component to each light receiving element 24.

The plurality of light receiving elements 24 are mounted on the carrier 31 and aligned along the direction A2 so as to face the plurality of lenses 23 in the direction A1, respectively. Each light receiving element 24 is, for example, a waveguide type light receiving element. Each light receiving element 24 is optically coupled to the optical demultiplexer 22 through each lens 23. The signal light component from each lens 23 is incident on the side surface of each light receiving element 24, for example. Each light receiving element 24 converts the corresponding signal light component into an electrical signal. Although four light receiving elements 24 are shown in the example shown in FIG. 1, the number of light receiving elements 24 is not particularly limited. The number of light receiving elements 24 may be any number of one or more.

The TIA 25 is mounted on the bottom surface 13*a* of the package 11 and arranged between the plurality of light receiving elements 24 and the feedthrough 26 in the direction A1. The TIA 25 is electrically connected to each light receiving element 24. The TIA 25 converts the current signal from each light receiving element 24 into a voltage signal. The TIA 25 is electrically connected to the wiring of the feedthrough 26 through a wire. A voltage signal output from the TIA 25 is output to the outside of the optical receiver 1 through the feedthrough 26.

Figure 3:
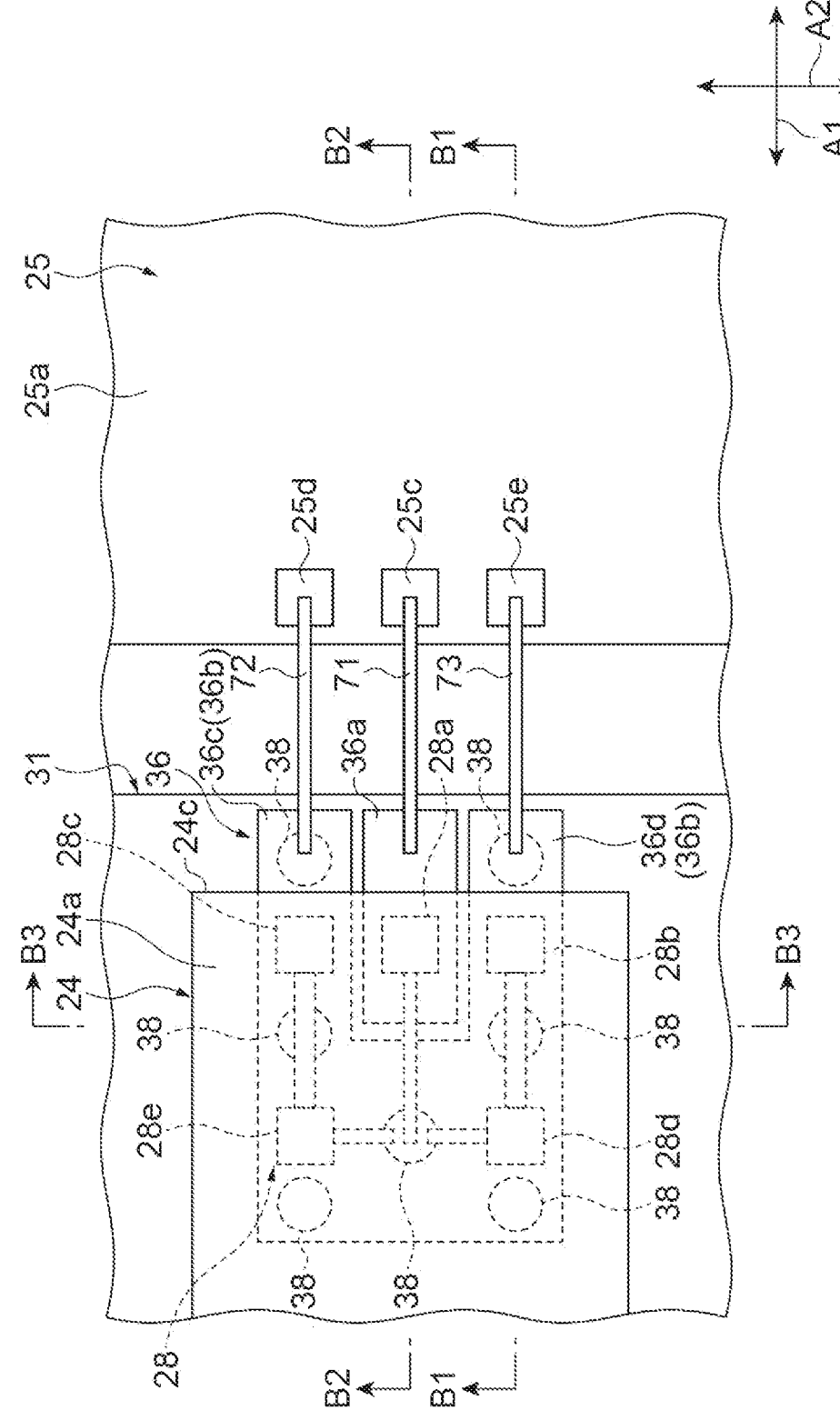
FIG. 3 is an enlarged plan view showing the peripheral structure of a light receiving element and a transimpedance amplifier in the optical receiver in FIG. 1.
Figure 4:
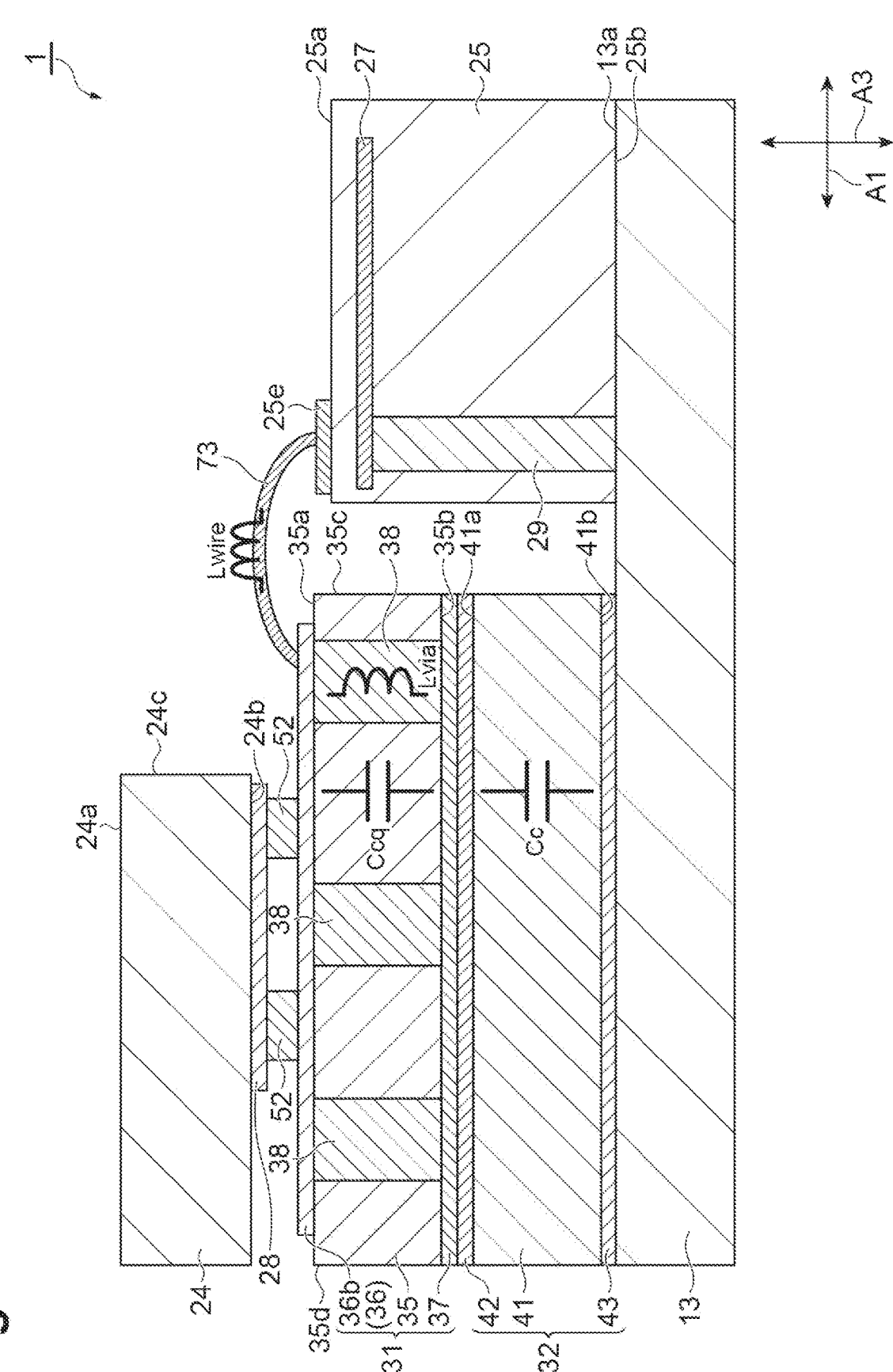
FIG. 4 is a cross-sectional view taken along the line B1-B1 in FIG. 3.
Figure 5:
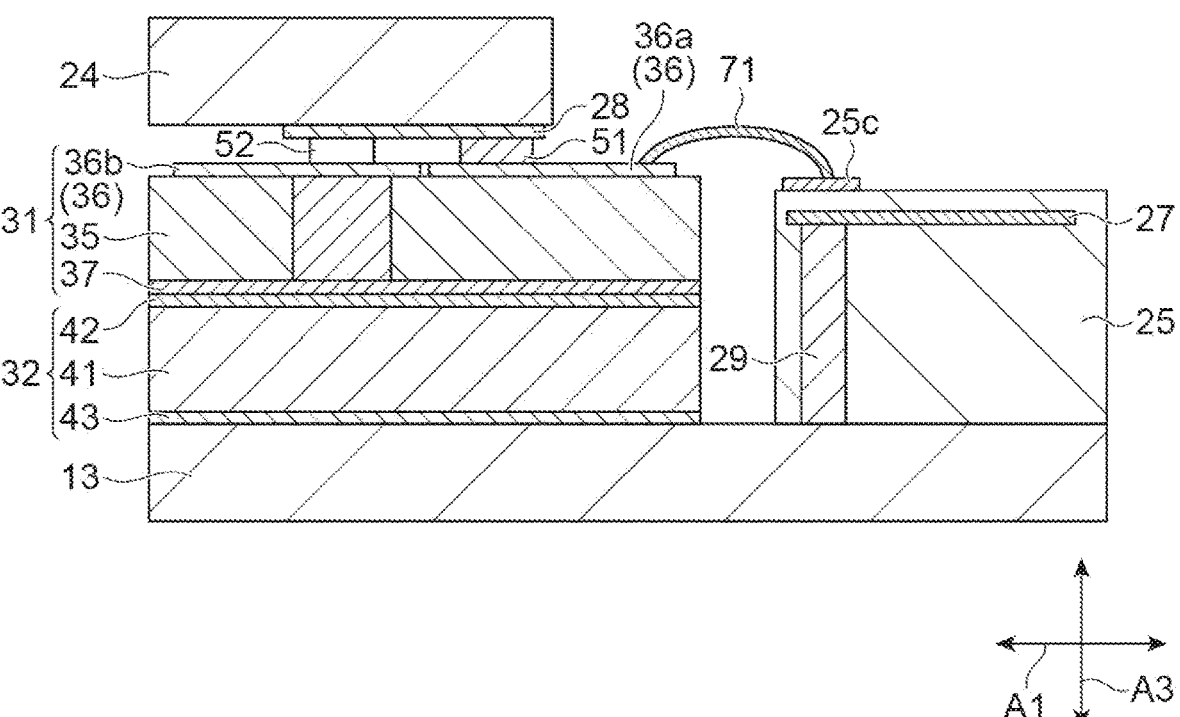
FIG. 5 is a cross-sectional view taken along the line B2-B2 in FIG. 3.
Figure 6:
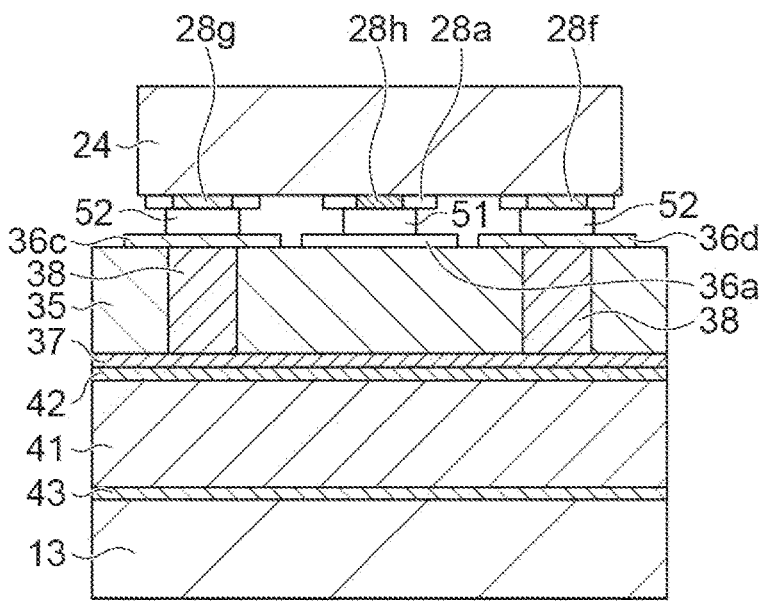
FIG. 6 is a cross-sectional view taken along the line B3-B3 in FIG. 3.
Figure 6:

FIG. 3 is an enlarged plan view showing the peripheral structure of the light receiving element 24 and the TIA 25. FIG. 4 is a cross-sectional view taken along the line B1-B1 in FIG. 3. FIG. 5 is a cross-sectional view taken along the line B2-B2 in FIG. 3, and FIG. 6 is a cross-sectional view taken along the line B3-B3 in FIG. 3.

The light receiving element 24 has, for example, a rectangular parallelepiped shape, and has a front surface 24*a*, a back surface 24*b*, and a side surface 24*c*. The front surface 24*a* and the back surface 24*b* are aligned along the direction A3. The front surface 24*a* faces a side opposite to the bottom plate 13 in the direction A3. The back surface 24*b* faces the carrier 31 in the direction A3. The side surface 24*c* faces the TIA 25 in the direction A1. The side surface 24*c* connects the front surface 24*a* and the back surface 24*b* to each other in the direction A3. A conductive film 28 is provided on the back surface 24*b*. The conductive film 28 is a metal film fixed to the back surface 24*b* of the light receiving element 24. The conductive film 28 is electrically connected to the cathode electrode and the anode electrode of the light receiving element 24.

The carrier 31 is a rectangular parallelepiped member on which the light receiving element 24 is mounted. The carrier 31 is arranged between the light receiving element 24 and the bottom surface 13*a* in the direction A3. The carrier 31 has an insulating carrier substrate 35. The material of the carrier substrate 35 is, for example, quartz. The carrier substrate 35 has a front surface 35*a*, a back surface 35*b*, and a pair of side surfaces 35*c* and 35*d*. The front surface 35*a* and the back surface 35*b* are aligned along the direction A3. The front surface 35*a* faces the back surface 24*b* of the light receiving element 24 in the direction A3. The back surface 35*b* faces the capacitor 32 in the direction A3. The pair of side surfaces 35*c* and 35*d* are aligned along the direction A1, and connect the front surface 35*a* and the back surface 35*b* to each other in the direction A3. One side surface 35*c* of the pair of side surfaces 35*c* and 35*d* faces the TIA 25 in the direction A1. The other side surface 35*d* of the pair of side surfaces 35*c* and 35*d* is arranged on a side opposite to the side surface 35*c* in the direction A1.

The carrier 31 further has a first conductive film 36 provided on the front surface 35*a* and a second conductive film 37 provided on the back surface 35*b*. The first conductive film 36 is a metal film fixed to the front surface 35*a*. The second conductive film 37 is a metal film fixed to the back surface 35*b*. A parasitic capacitance $C_{cq}$ (see FIG. 4) is generated between the first conductive film 36 and the second conductive film 37. The parasitic capacitance $C_{cq}$ is, for example, within the range of 10 fF or more and 100 fF or less.

Figure 7:
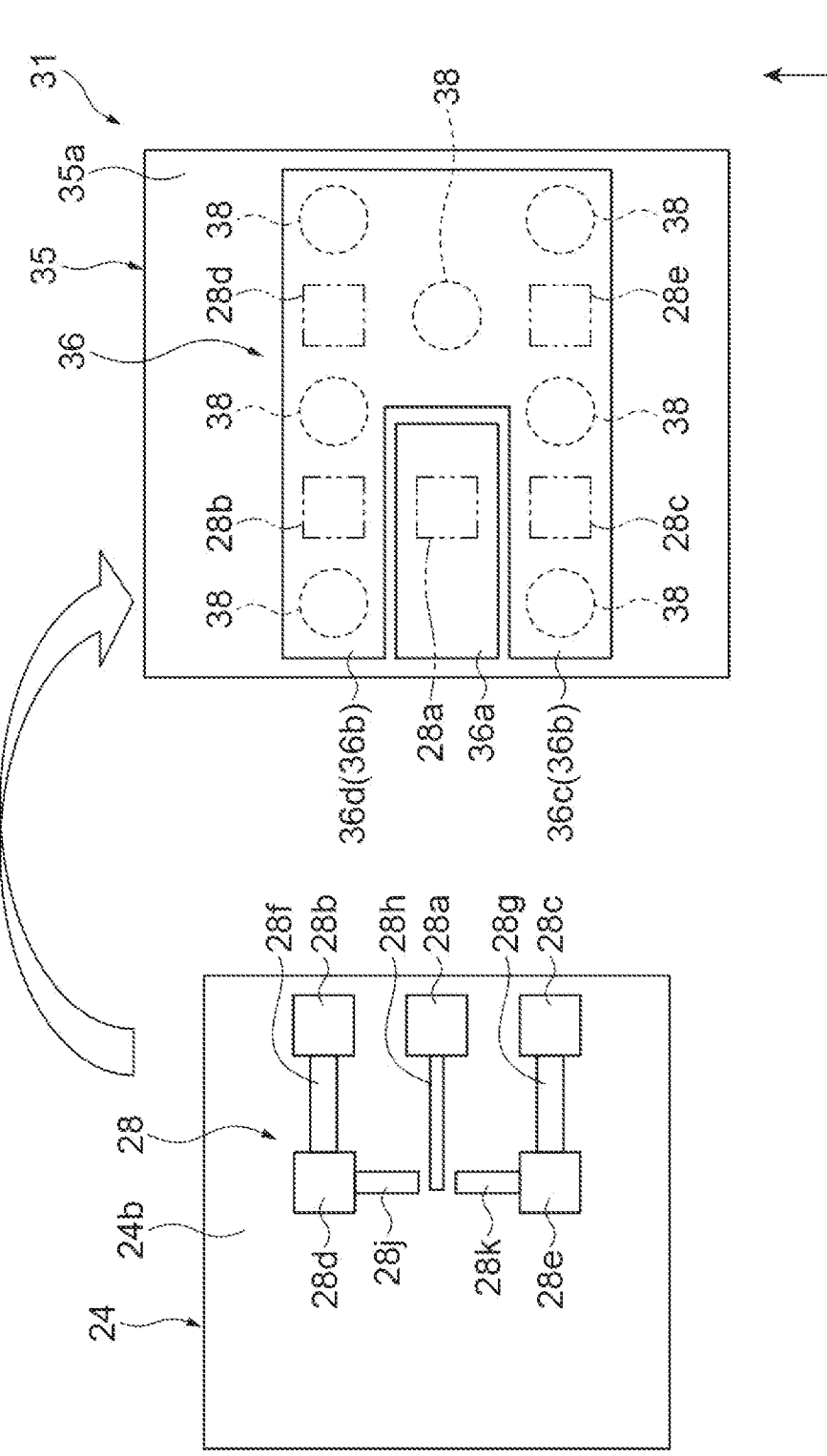
FIG. 7 is a diagram showing how a light receiving element and a carrier are flip-chip bonded to each other.

The carrier 31 and the light receiving element 24 are flip-chip bonded to each other (FCB: Flip Chip Bonding). That is, the light receiving element 24 is mounted on the carrier 31 in a flip manner. FIG. 7 is a diagram showing how the light receiving element 24 and the carrier 31 are flip-chip bonded to each other. As shown in FIG. 7, the conductive film 28 provided on the back surface 24*b* of the light receiving element 24 has an anode pad 28*a*, a first cathode pad 28*b*, a second cathode pad 28*c*, a third cathode pad 28*d*, and a fourth cathode pad 28*e*.

The first cathode pad 28*b* and the second cathode pad 28*c* are aligned so as to be spaced apart from each other along the direction A2, and the anode pad 28*a* is arranged between the first cathode pad 28*b* and the second cathode pad 28*c*. Therefore, the first cathode pad 28*b* and the second cathode pad 28*c* are respectively arranged on both sides of the anode pad 28*a* in the direction A2. The third cathode pad 28*d* and the fourth cathode pad 28*e* are aligned so as to be spaced apart from each other along the direction A2, and are arranged at positions aligned with the first cathode pad 28*b* and the second cathode pad 28*c*, respectively, in the direction A1.

An anode pattern 28*h* extending linearly along the direction A1 is connected to the anode pad 28*a*. A distal end portion of the anode pattern 28*h* facing the anode pad 28*a* is an anode electrode of the light receiving element 24, and the light receiving element 24 is electrically connected to the anode electrode (that is, the distal end portion of the anode pattern 28*h*). The first cathode pad 28*b* and the third cathode pad 28*d* are connected to each other by a cathode pattern 28*f* extending linearly along the direction A1. The second cathode pad 28*c* and the fourth cathode pad 28*e* are connected to each other by a cathode pattern 28*g* extending linearly along the direction A1. The cathode patterns 28$f$ and 28$g$ are arranged on both sides of the anode pattern 28$h$ in the direction A2.

A cathode pattern 28$j$ extending linearly toward the anode pattern 28$h$ in the direction A2 is connected to the third cathode pad 28$d$. The first cathode pad 28$b$ and the third cathode pad 28$d$ are electrically connected to the cathode electrode of the light receiving element 24 through the cathode patterns 28$f$ and 28$j$. A cathode pattern 28$k$ extending linearly toward the anode pattern 28$h$ in the direction A2 is connected to the fourth cathode pad 28$e$. The second cathode pad 28$c$ and the fourth cathode pad 28$e$ are electrically connected to the cathode electrode of the light receiving element 24 through the cathode patterns 28$g$ and 28$k$. The width of the anode pattern 28$h$ is smaller than the width of each of the cathode patterns 28$f$, 28$g$, 28$j$, and 28$k$.

The first conductive film 36 provided on the front surface 35$a$ of the carrier 31 has an anode wiring pattern 36$a$ and a cathode wiring pattern 36$b$. The anode wiring pattern 36$a$ is a linear wiring pattern extending along the direction A1. The cathode wiring pattern 36$b$ is a U-shaped wiring pattern that opens on one side in the direction A1. The anode wiring pattern 36$a$ is arranged in the opening of the cathode wiring pattern 36$b$ and surrounded by the cathode wiring pattern 36$b$. The anode wiring pattern 36$a$ is arranged at a position overlapping the anode pad 28$a$ of the light receiving element 24 in plan view. The anode wiring pattern 36$a$ is electrically connected to the anode pad 28$a$ through a pillar 51 (see FIGS. 5 and 6), for example. The anode wiring pattern 36$a$ may be electrically connected to the anode pad 28$a$ through a bump.

The cathode wiring pattern 36$b$ has a first portion 36$c$ (first wiring pattern) and a second portion 36$d$ provided on both sides of the anode wiring pattern 36$a$ in the direction A2. The first portion 36$c$ is arranged at a position overlapping the second cathode pad 28$c$ and the fourth cathode pad 28$e$ in plan view. The second portion 36$d$ is arranged at a position overlapping the first cathode pad 28$b$ and the third cathode pad 28$d$ in plan view. The cathode wiring pattern 36$b$ is electrically connected to the cathode pads 28$b$, 28$c$, 28$d$, and 28$e$ through pillars 52 (see FIGS. 4 and 6), for example. The cathode wiring pattern 36$b$ may be electrically connected to the cathode pads 28$b$, 28$c$, 28$d$, and 28$e$ through bumps.

FIG. 4 is referred to again. The capacitor 32 is a rectangular parallelepiped member on which the carrier 31 is mounted. The capacitor 32 is mounted on the bottom surface 13$a$ of the bottom plate 13. Therefore, the capacitor 32 is arranged between the carrier 31 and the bottom surface 13$a$ in the direction A3. The capacitor 32 is, for example, a capacitive element such as a chip capacitor. The capacitor 32 has a dielectric layer 41, a first metal film 42, and a second metal film 43. The dielectric layer 41 is interposed between the first metal film 42 and the second metal film 43 in direction A3. The dielectric layer 41 functions as an insulating layer that electrically insulates the first metal film 42 and the second metal film 43 from each other. The thickness of the dielectric layer 41 is, for example, larger than each of the thickness of the first metal film 42 and the thickness of the second metal film 43. The dielectric layer 41 has a front surface 41$a$ and a back surface 41$b$ aligned along the direction A3. The front surface 41$a$ faces the back surface 35$b$ of the carrier 31. The first metal film 42 is provided on the front surface 41$a$. Therefore, the first metal film 42 is arranged between the dielectric layer 41 and the second conductive film 37 provided on the back surface 35$b$ of the carrier 31. The first metal film 42 is conductively bonded to the second conductive film 37 through a conductive adhesive, such as solder.

The back surface 41$b$ of the dielectric layer 41 faces the bottom surface 13$a$ of the bottom plate 13. The second metal film 43 is provided on the back surface 41$b$. Therefore, the second metal film 43 is arranged between the dielectric layer 41 and the bottom surface 13$a$. The second metal film 43 is conductively bonded to the bottom surface 13$a$ through a conductive adhesive, such as solder. An electrostatic capacitance $C_c$ of the capacitor 32 is generated between the first metal film 42 and the second metal film 43 between which the dielectric layer 41 is interposed. The electrostatic capacitance $C_c$ of the capacitor 32 is connected in series with the parasitic capacitance $C_{cq}$ generated between the first conductive film 36 and the second conductive film 37. The electrostatic capacitance $C_c$ of the capacitor 32 is sufficiently larger than the parasitic capacitance $C_{cq}$. The parasitic capacitance $C_{cq}$ is, for example, 10 fF or more and 100 fF or less, while the electrostatic capacitance $C_c$ of the capacitor 32 is, for example, 10 pf or more.

The TIA 25 is mounted on the bottom surface 13$a$ of the bottom plate 13 and electrically connected to the bottom surface 13$a$. Therefore, the ground potential (reference potential) of the TIA 25 matches the electric potential of the bottom surface 13$a$. The TIA 25 is arranged side by side with the light receiving element 24 in the direction A1. The TIA 25 has, for example, a rectangular parallelepiped shape, and has a front surface 25$a$ and a back surface 25$b$. The front surface 25$a$ and the back surface 25$b$ are aligned along the direction A3. The back surface 25$b$ is conductively bonded to the bottom surface 13$a$ through a conductive adhesive, such as solder. The front surface 25$a$ is arranged on a side opposite to the bottom surface 13$a$ in the direction A3.

The TIA 25 further has a signal pad 25$c$, a first bias pad 25$d$, and a second bias pad 25$e$. The signal pad 25$c$, the first bias pad 25$d$, and the second bias pad 25$e$ are provided on the front surface 25$a$ of the TIA 25. The first bias pad 25$d$ and the second bias pad 25$e$ are arranged on both sides of the signal pad 25$c$ in the direction A2. The signal pad 25$c$ is connected to the anode wiring pattern 36$a$ of the first conductive film 36 through a wire 71 (see FIG. 3). That is, one end of the wire 71 is connected to the signal pad 25$c$, and the other end of the wire 71 is connected to the anode wiring pattern 36$a$.

The first bias pad 25$d$ is connected to the first portion 36$c$ of the cathode wiring pattern 36$b$ through a wire 72 (see FIG. 3). That is, one end of the wire 72 is connected to the first bias pad 25$d$, and the other end of the wire 72 is connected to the first portion 36$c$ of the cathode wiring pattern 36$b$. The second bias pad 25$e$ is connected to the second portion 36$d$ of the cathode wiring pattern 36$b$ through a wire 73. That is, one end of the wire 73 is connected to the second bias pad 25$e$, and the other end of the wire 73 is connected to the second portion 36$d$ of the cathode wiring pattern 36$b$.

A ground layer 27 is provided inside the TIA 25. The ground layer 27 extends along the directions A1 and A2 inside the TIA 25. The ground layer 27 is provided at a position closer to the front surface 25$a$ between the front surface 25$a$ and the back surface 25$b$. The ground layer 27 is connected to the back surface 25$b$ through a via 29. The via 29 penetrates between the ground layer 27 and the back surface 25$b$ in the direction A3 inside the TIA 25. The ground layer 27 is electrically connected to the bottom surface 13*a* of the bottom plate 13 through the via 29. Therefore, the ground potential is applied to the ground layer 27.

As shown in FIG. 4, the carrier 31 further includes a plurality of vias 38. The plurality of vias 38 are formed of a conductive material. The plurality of vias 38 penetrate the carrier substrate 35 in the direction A3, and are connected to the first conductive film 36 and the second conductive film 37 between which the carrier substrate 35 is interposed. Therefore, the first conductive film 36 and the second conductive film 37 are electrically connected to each other through the plurality of vias 38. In this case, the inductance $L_{via}$ of each via 38 is connected in parallel with the inductance $L_{wire}$ of the wires 72 and 73. As shown in FIG. 3, the plurality of vias 38 are formed only in a region overlapping the cathode wiring pattern 36*b* in plan view. That is, the plurality of vias 38 are formed only in a region between cathode wiring pattern 36*b* and the second conductive film 37 in the direction A3. Therefore, the plurality of vias 38 are not formed in a region overlapping the anode wiring pattern 36*a* in plan view, that is, a region between the anode wiring pattern 36*a* and the second conductive film 37 in the direction A3.

As shown in FIGS. 3 and 7, the plurality of vias 38 are spaced apart from each other and arranged at equal intervals in plan view. The respective inner diameters of the plurality of vias 38 may be set to be the same as each other, for example. A combined inductance $L_{via}$ of the plurality of vias 38 is sufficiently smaller than a combined inductance $L_{wire}$ of the wires 72 and 73. The combined inductance $L_{wire}$ of the wires 72 and 73 is, for example, 0.1 nH or more and 0.5 nH or less, while the combined inductance $L_{via}$ of the plurality of vias 38 is, for example, 0.05 nH or less. Although seven vias 38 are shown in the examples shown in FIGS. 3 and 7, the number of vias 38 is not limited to seven and may be any number. The number of vias 38 may be one, or may be two, three, or eight or more. In the examples shown in FIGS. 3 and 7, the plurality of vias 38 are arranged at positions not overlapping the anode pad 28*a* and the cathode pads 28*b*, 28*c*, 28*d*, and 28*e* of the light receiving element 24, but may be arranged at positions overlapping these pads.

Operational Effects

Figure 8:
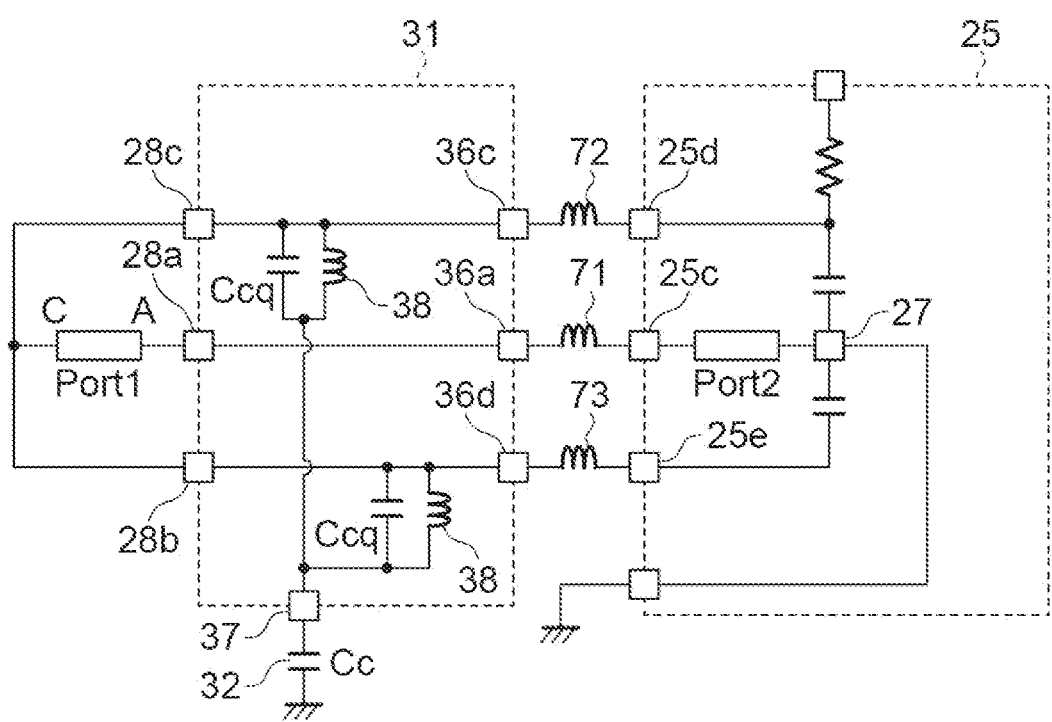
FIG. 8 is an equivalent circuit diagram between the light receiving element and the transimpedance amplifier in the optical receiver shown in FIG. 1.
Figure 9:
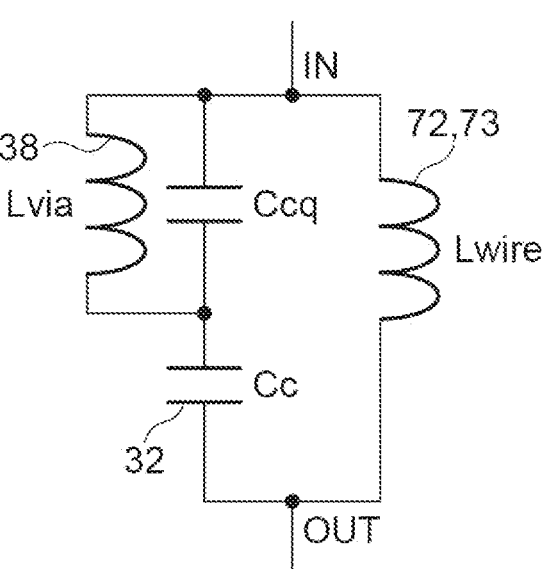
FIG. 9 is an equivalent circuit diagram of a part extracted from FIG. 8.

The effects obtained by the optical receiver 1 according to the present embodiment described above will be described together with the problems of comparative examples. FIG. 8 is an equivalent circuit diagram between the light receiving element 24 and the TIA 25 in the optical receiver 1 according to the present embodiment. FIG. 9 is an equivalent circuit diagram of a part extracted from FIG. 8. In FIG. 8, "Port 1" indicates a portion set between an anode (A) and a cathode (C) of the light receiving element 24, and "Port 2" indicates a portion set between the signal pad 25*c* of the TIA 25 and the ground layer 27.

As shown in FIG. 8, in the optical receiver 1, the cathode (C) of the light receiving element 24 is connected to the first bias pad 25*d* and the second bias pad 25*e* of the TIA 25 through the wires 72 and 73, respectively. The anode (A) of the light receiving element 24 is connected to the signal pad 25*c* of the TIA 25 through the wire 71. The ground layer 27 of the TIA 25 is electrically connected to the bottom surface 13*a* of the bottom plate 13. Then, the parasitic capacitance $C_{cq}$ is present between the cathode wiring pattern 36*b* and the second conductive film 37. In addition, in the present embodiment, the capacitor 32 is provided between the second conductive film 37 and the bottom plate 13, and a plurality of vias 38 are formed between the cathode wiring pattern 36*b* and the second conductive film 37. Therefore, as shown in FIG. 9, the electrostatic capacitance $C_c$ of the capacitor 32 is connected in series with the parasitic capacitance $C_{cq}$, and the inductance $L_{via}$ of each via 38 is connected in parallel with the parasitic capacitance $C_{cq}$.

A power supply (bias) voltage is input from the first bias pad 25*d* and the second bias pad 25*e* of the TIA 25 to the first portion 36*c* and the second portion 36*d* of the cathode wiring pattern 36*b* through the wires 72 and 73, respectively. When the signal light L is incident on the light receiving element 24, the light receiving element 24 outputs a current signal (high frequency current) having a magnitude corresponding to the amount of light. This current signal is input from the anode (A) of the light receiving element 24 to the signal pad 25*c* of the TIA 25 through the anode pad 28*a*, the anode wiring pattern 36*a*, and the wire 71. The TIA 25 converts the input current signal into a voltage signal. This voltage signal is provided to the outside of the optical receiver 1 or to other electronic components inside the optical receiver 1.

Figure 17:
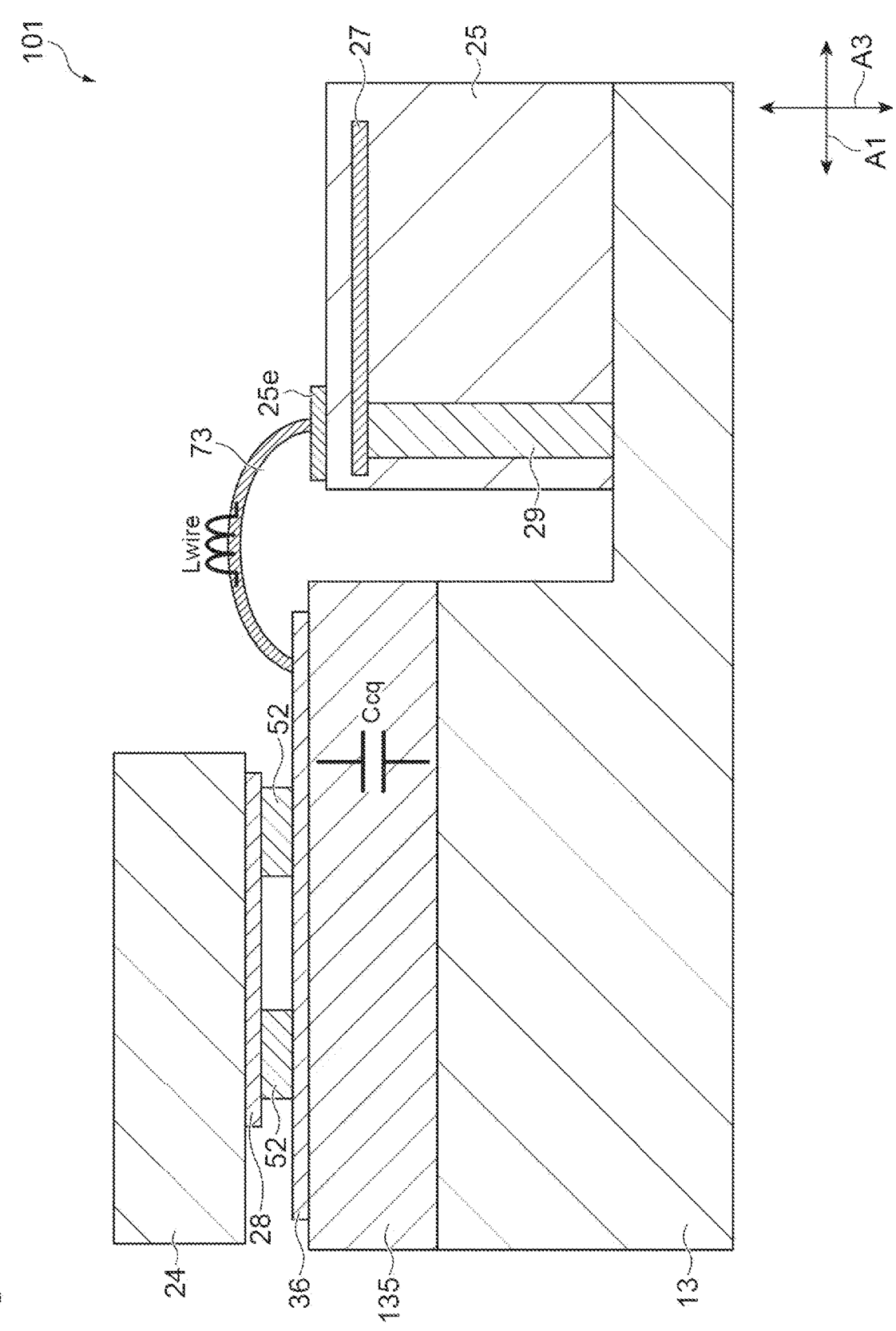
FIG. 17 is a cross-sectional view showing an optical receiver according to a first comparative example.
Figure 18:
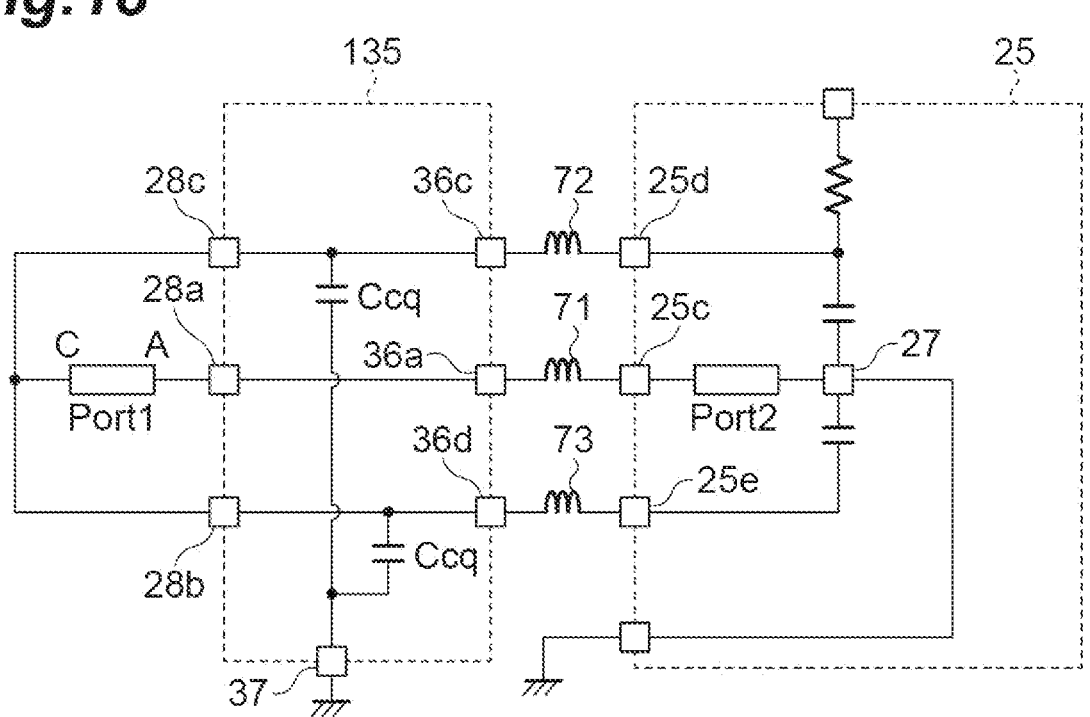
FIG. 18 is an equivalent circuit diagram between a light receiving element and a transimpedance amplifier in the optical receiver shown in FIG. 17.
Figure 19:
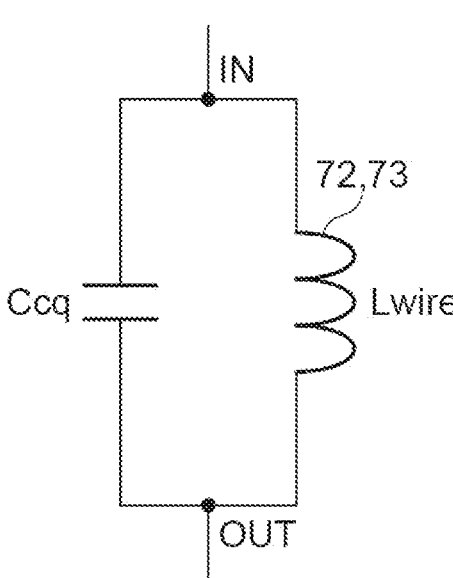
FIG. 19 is an equivalent circuit diagram of a part extracted from FIG. 18.

FIG. 17 is a cross-sectional view showing an optical receiver 101 according to a first comparative example. In the optical receiver 101, unlike the optical receiver 1 according to the present embodiment, a plurality of vias are not formed in a carrier substrate 135 and a capacitor is not provided between the carrier substrate 135 and the bottom plate 13. Therefore, the optical receiver 101 has a configuration in which the carrier substrate 135 is directly mounted on the bottom plate 13. FIG. 18 is an equivalent circuit diagram between the light receiving element 24 and the TIA 25 in the optical receiver 101. FIG. 19 is an equivalent circuit diagram of a part extracted from FIG. 18. In the equivalent circuit diagram shown in FIG. 18, the current signal from the light receiving element 24, for example, passes through the wire 71 and the signal pad 25*c* from the anode (A) of the light receiving element 24 and reaches the ground layer 27 of the TIA 25, and is then capacitively coupled to the first bias pad 25*d* and the second bias pad 25*e* of the TIA 25. Then, the current signal flows through a path returning to the cathode (C) of the light receiving element 24 through the wires 72 and 73.

Here, since the parasitic capacitance $C_{eq}$ is generated between the first conductive film 36 and the second conductive film 37, the parasitic capacitance $C_{eq}$ and the combined inductance $L_{wire}$ of the wires 72 and 73 are connected in parallel with each other to form a parallel resonance circuit. FIG. 19 shows a parallel resonance circuit formed by the inductance $L_{wire}$ and the parasitic capacitance $C_{eq}$. The resonance frequency $f_1$ of the parallel resonance circuit is expressed by the following Equation (1). When the resonance frequency $f_1$ approaches the frequency band (for example, several tens of GHz or more) of the transmission signal, the return current from the TIA 25 to the light receiving element 24 decreases. At this time, the flow of the current signal from the light receiving element 24 to the TIA 25 is blocked, so that the signal is not transmitted.

[Equation 1]

$$f_1 = \frac{1}{2\pi}\sqrt{\frac{1}{L_{wire}C_{cq}}} \tag{1}$$

Figure 20:
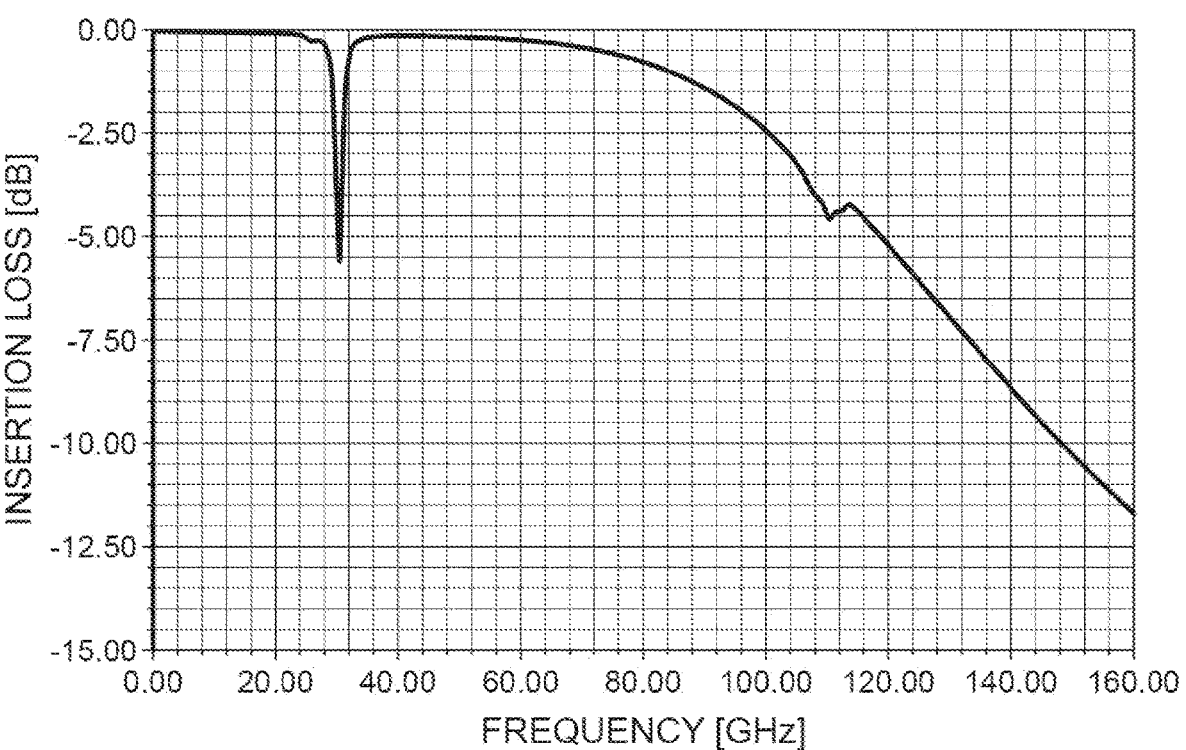
FIG. 20 is a graph showing a simulation result of a relationship between insertion loss and a signal frequency in the optical receiver shown in FIG. 17.

FIG. 20 is a graph showing a simulation result of the relationship between the insertion loss (unit: dB) and the signal frequency (unit: GHz) in the optical receiver 101. In the optical communication system, 100G transmission is the mainstream in a branch line system and a data center and between the branch line system and the data center. In the future, high-speed transmission such as 800G transmission is planned. At such a transmission speed, the frequency band of transmission signals is from several tens of GHz to around 100 GHz. On the other hand, in the optical receiver 101, as shown in FIG. 20, since the insertion loss drops significantly around 30 GHz, it can be seen that the resonance frequency $f_1$ is present around 30 GHz. In this case, since the resonance frequency $f_1$ overlaps the frequency band of the transmission signal, the non-transmission band of the transmission signal is generated as described above. As a result, degradation of the communication quality such as signal waveform degradation and inter-channel crosstalk may occur.

Figure 21:
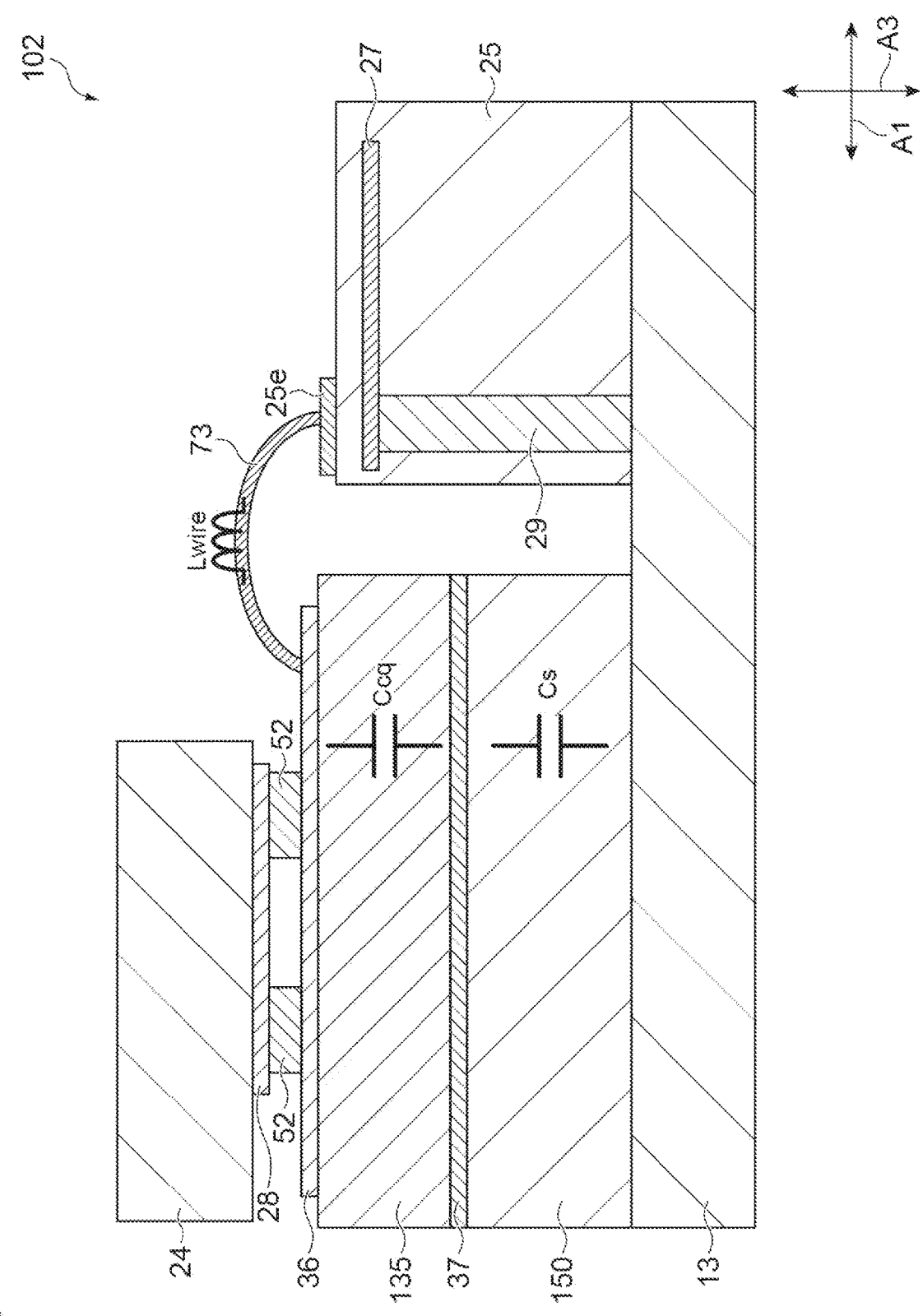
FIG. 21 is a cross-sectional view showing an optical receiver according to a second comparative example.
Figure 22:
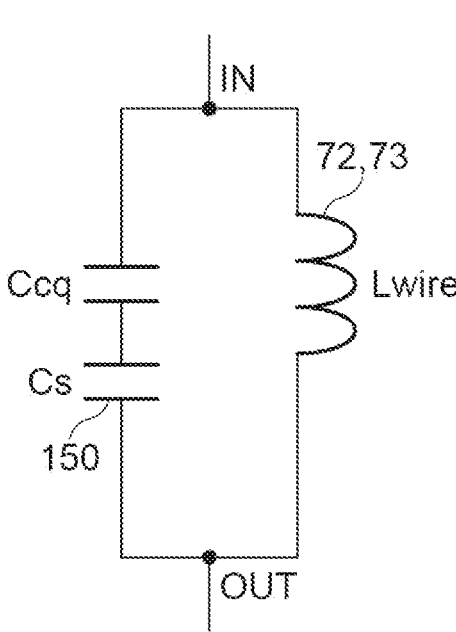
FIG. 22 is an equivalent circuit diagram between a light receiving element and a transimpedance amplifier in the optical receiver shown in FIG. 21.
Figure 23:
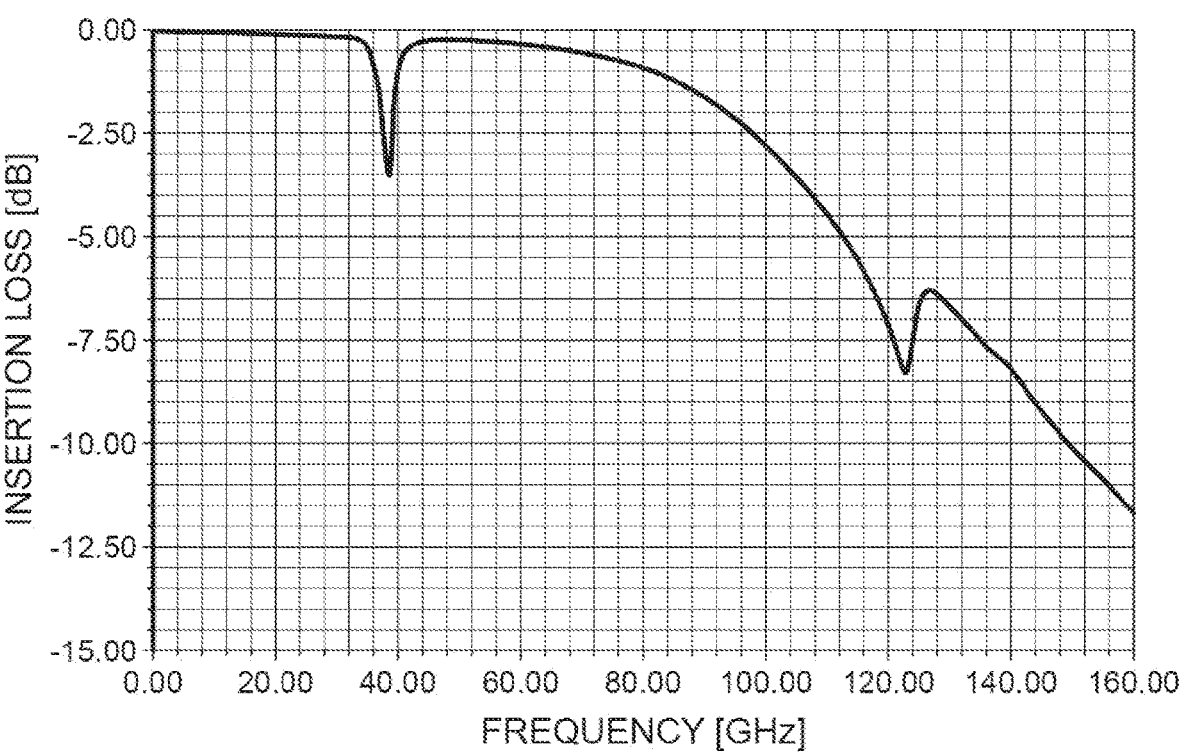
FIG. 23 is a graph showing a simulation result of a relationship between insertion loss and a signal frequency in the optical receiver shown in FIG. 21.

FIG. 21 is a cross-sectional view showing an optical receiver 102 according to a second comparative example. FIG. 22 is an equivalent circuit diagram between the light receiving element 24 and the TIA 25 in the optical receiver 102. FIG. 23 is a graph showing a simulation result of the relationship between the insertion loss (unit: dB) and the signal frequency (unit: GHz) in the optical receiver 102.

The optical receiver 102 has a configuration in which a ceramic substrate 150 is further added between the carrier substrate 135 and the bottom plate 13 of the optical receiver 101 according to the first comparative example. The ceramic substrate 150 has an electrostatic capacitance $C_s$ of, for example, 10 fF or more and 100 fF or less. By placing the ceramic substrate 150 below the carrier substrate 135 as described above, it is conceivable to reduce the capacitance between the first conductive film 36 on the carrier substrate 135 and the bottom plate 13 to shift the resonance frequency to the high frequency side. In this configuration, as shown in FIG. 22, the electrostatic capacitance $C_s$ of the ceramic substrate 150 is connected in series with the parasitic capacitance $C_{cq}$ between the first conductive film 36 and the second conductive film 37. In this case, the resonance frequency $f_2$ of the parallel resonance circuit shown in FIG. 22 is expressed by the following Equation (2).

[Equation 2]

$$f_2 = \frac{1}{2\pi} \sqrt{\frac{1}{L_{wire} \frac{C_{cq}C_s}{C_{cq} + C_s}}} \tag{2}$$

However, in the optical receiver 102, the resonance frequency $f_2$ cannot be sufficiently shifted to the high frequency side if the electrostatic capacitance $C_s$ cannot be made sufficiently smaller than the parasitic capacitance $C_{cq}$. As shown in FIG. 23, the resonance frequency $f_2$ of the parallel resonance circuit in the optical receiver 102 just shifts to the slightly higher frequency side than the resonance frequency $f_1$ in the case of the first comparative example 1, and is present around 40 GHz. This resonance frequency $f_2$ overlaps the frequency band of the transmission signal. Therefore, the effect of shifting the resonance frequency $f_2$ cannot be sufficiently obtained with the measure of placing the ceramic substrate 150 below the carrier substrate 135 as in the second comparative example.

Figure 24:
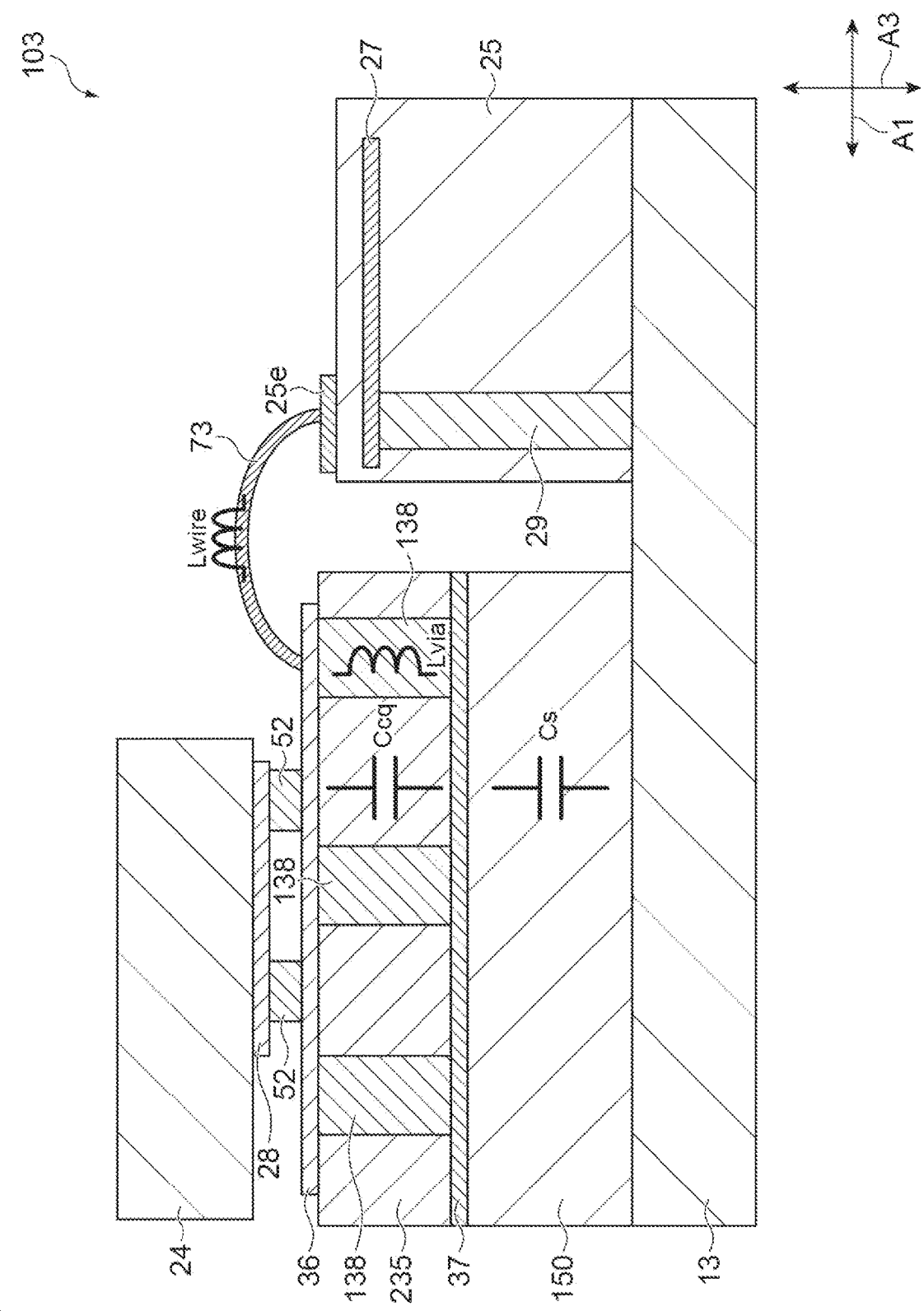
FIG. 24 is a cross-sectional view showing an optical receiver according to a third comparative example.
Figure 25:
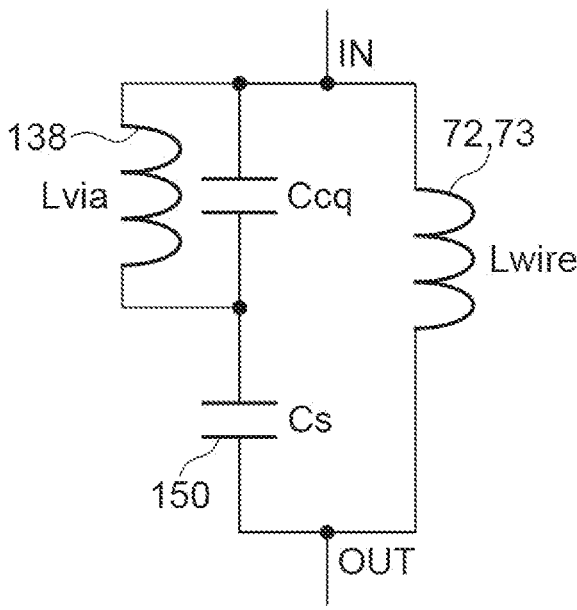
FIG. 25 is an equivalent circuit diagram between a light receiving element and a transimpedance amplifier in the optical receiver shown in FIG. 24.
Figure 26:
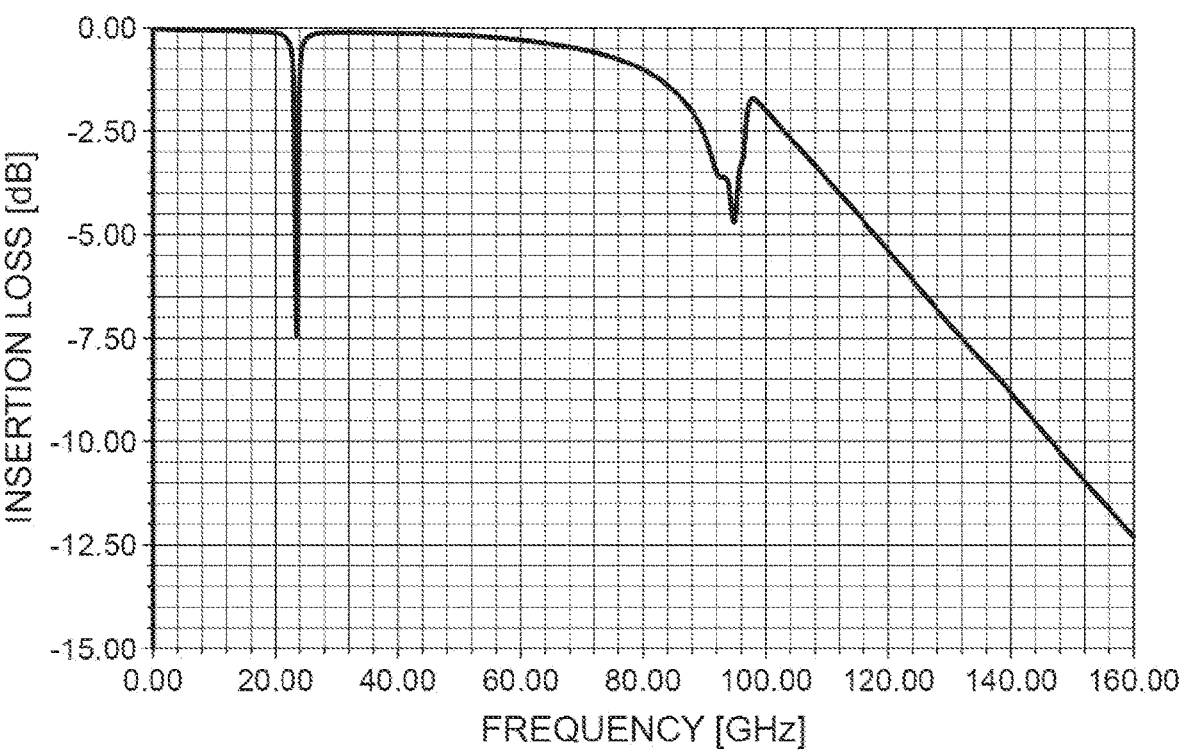
FIG. 26 is a graph showing a simulation result of a relationship between insertion loss and a signal frequency in the optical receiver shown in FIG. 24.

FIG. 24 is a cross-sectional view showing an optical receiver 103 according to a third comparative example. FIG. 25 is an equivalent circuit diagram between the light receiving element 24 and the TIA 25 in the optical receiver 103. FIG. 26 is a graph showing a simulation result of the relationship between the insertion loss (unit: dB) and the signal frequency (unit: GHz) in the optical receiver 103.

The optical receiver 103 according to the third comparative example has a configuration in which a plurality of vias 138 are formed in the carrier substrate 135 of the optical receiver 102 according to the second comparative example. That is, the optical receiver 103 includes a carrier substrate 235 in which a plurality of vias 138 are formed, instead of the carrier substrate 135 of the optical receiver 102. In this configuration, a plurality of vias 138 penetrate the inside of the carrier substrate 235 and are connected to the first conductive film 36 and the second conductive film 37 between which the carrier substrate 235 is interposed. In this case, as shown in the parallel resonance circuit of FIG. 25, the combined inductance $L_{via}$ of the plurality of vias 138 is connected in parallel with the parasitic capacitance $C_{cq}$ between the first conductive film 36 and the second conductive film 37.

Here, since the inductance $L_{via}$ is sufficiently smaller than the inductance $L_{wire}$ and the parasitic capacitance $C_{cq}$ is sufficiently smaller than the electrostatic capacitance $C_s$ of the ceramic substrate 150, the resonance frequency $f_3$ of the parallel resonance circuit shown in FIG. 25 is expressed by the following Equation (3) when the inductance $L_{via}$ and the parasitic capacitance $C_{cq}$ are approximated to zero. Therefore, the inductance $L_{wire}$ and the electrostatic capacitance $C_s$ dominantly act on the resonance frequency $f_3$ in the optical receiver 103.

[Equation 3]

$$f_3 = \frac{1}{2\pi} \sqrt{\frac{1}{L_{wire}C_s}} \tag{3}$$

However, as shown in FIG. 26, the resonance frequency $f_3$ is present around 30 GHZ. For this reason, the resonance frequency $f_3$ overlaps the frequency band of the transmission signal. Therefore, also in the optical receiver 103, there is a non-transmission band of the transmission signal as described above.

On the other hand, the optical receiver 1 according to the present embodiment includes the carrier 31 in which a plurality of vias 38 are formed and the capacitor 32 provided between the carrier 31 and the bottom plate 13. In the optical receiver 1, the combined inductance $L_{via}$ of the plurality of vias 38 is connected in parallel with the parasitic capacitance $C_{cq}$ between the first conductive film 36 and the second conductive film 37, and the electrostatic capacitance $C_s$ of the capacitor 32 is connected in series with the parasitic capacitance $C_{cq}$. Then, since the inductance $L_{via}$ is sufficiently smaller than the inductance $L_{wire}$ and the parasitic capacitance $C_{cq}$ is sufficiently smaller than the electrostatic capacitance $C_c$, the resonance frequency f of the parallel resonance circuit shown in FIG. 9 is expressed by the following Equation (4) when the inductance $L_{via}$ and the parasitic capacitance $C_{cq}$ are approximated to zero. Therefore, in the present embodiment, the inductance $L_{wire}$ and the electrostatic capacitance $C_c$ dominantly act on the resonance frequency f.

[Equation 4]

$$f_4 = \frac{1}{2\pi}\sqrt{\frac{1}{L_{wire}C_c}} \qquad (4)$$

Figure 10:
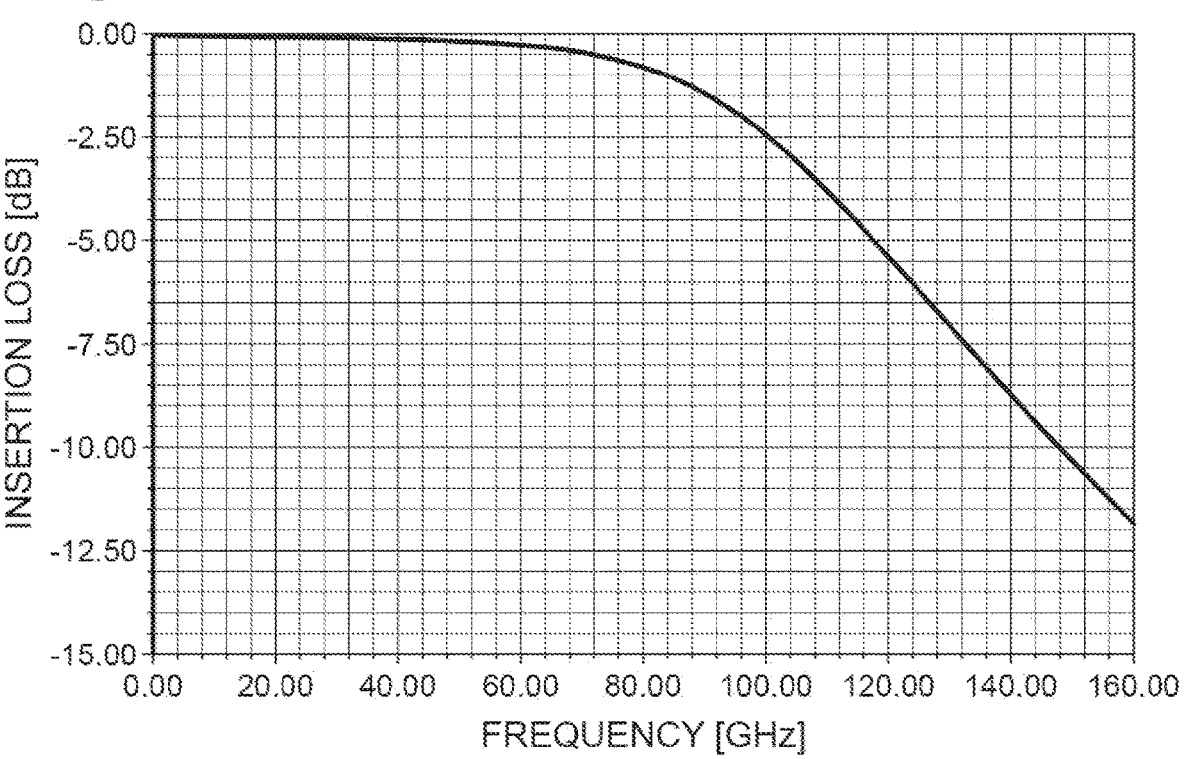
FIG. 10 is a graph showing a simulation result of a relationship between insertion loss and a signal frequency in the optical receiver shown in FIG. 1.

Here, the electrostatic capacitance $C_c$ is sufficiently larger than the electrostatic capacitance $C_s$ according to the third comparative example. For this reason, the resonance frequency f becomes lower than the resonance frequency $f_3$ according to the third comparative example and greatly shifts to the low frequency side. FIG. 10 is a graph showing a simulation result of the relationship between the insertion loss (unit: dB) and the signal frequency (unit: GHz) in the optical receiver 1 according to the present embodiment. As shown in FIG. 10, it can be seen that the resonance frequency f has shifted to the extremely low frequency side of, for example, 5 GHz or less, and is not present in the frequency band of the transmission signal, such as several tens of GHz or 100 GHz. Thus, in the present embodiment, it is possible to sufficiently shift the resonance frequency f to the lower frequency side than the frequency band of the transmission signal. In other words, the non-transmission band due to resonance can be removed from the frequency band of the transmission signal. As a result, it is possible to suppress degradation of the communication quality such as signal waveform degradation and inter-channel crosstalk. In addition, in the present embodiment, unlike the case where the light receiving element and the TIA are flip-chip bonded to each other, it is not necessary to use a TIA having a dedicated pad for flip-chip bonding. Therefore, the degree of freedom in combining the light receiving element and the TIA is high.

It is considered that the resonance frequency of the inductance $L_{via}$ and the parasitic capacitance $C_{cq}$ is present on the higher frequency side than the frequency band of the transmission signal. This resonance frequency is considered to shift to the high frequency side as the number of vias 38 increases, and is not present in the frequency band of the transmission signal. In the optical receiver 1 according to the present embodiment, the electrostatic capacitance $C_c$ of the capacitor 32 is sufficiently large and can be regarded as being short-circuited with respect to high frequencies. Therefore, this can be regarded as a state in which the wires 72 and 73 and the via 38 are connected in parallel with the ground. In this case, as the number of vias 38 increases, the combined inductance $L_{via}$ appears to decrease. Therefore, it is considered that the resonance frequency between the inductance $L_{via}$ and the parasitic capacitance $C_{cq}$ shifts to the high frequency side. On the other hand, in the optical receiver 103 according to the third comparative example, since the electrostatic capacitance $C_s$ of the ceramic substrate 150 is smaller than the electrostatic capacitance $C_c$ of the capacitor 32, it cannot be regarded as a state in which the wires 72 and 73 and the via 138 are connected in parallel with the ground. For this reason, it is considered that the combined inductance $L_{via}$ does not appear to decrease. Therefore, in the optical receiver 103, unlike the optical receiver 1 according to the present embodiment, it is considered that there is a resonance point (see FIG. 26) around 100 GHz on the high frequency side.

In the present embodiment, the first portion 36c and the second portion 36d of the cathode wiring pattern 36b are arranged on both sides of the anode wiring pattern 36a. In this case, since magnetic fields generated by the current flowing through the light receiving element 24 cancel each other out, the magnetic fields are less likely to leak outside the cathode wiring pattern 36b. Therefore, it is possible to reduce crosstalk due to electromagnetic coupling to other wiring patterns.

In the present embodiment, the first metal film 42 electrically connected to the second conductive film 37 is provided on the front surface 41a of the dielectric layer 41, and the second metal film 43 electrically connected to the bottom surface 13a of the bottom plate 13 is provided on the back surface 41b of the dielectric layer 41. Therefore, it becomes easy to bond the dielectric layer 41 to the first metal film 42 and the second metal film 43.

In the present embodiment, the first metal film 42, the dielectric layer 41, and the second metal film 43 form a chip capacitor. Therefore, it is possible to easily realize the capacitor 32 having the electrostatic capacitance $C_c$ larger than the parasitic capacitance $C_{cq}$. In the present embodiment, a plurality of vias 38 penetrate the inside of the carrier 31 and are connected to the first conductive film 36 and the second conductive film 37. The plurality of vias 38 are arranged at positions spaced apart from each other in plan view. In this case, is possible to easily realize a configuration that is connected in parallel with the parasitic capacitance $C_{cq}$ and has an inductance smaller than the inductance $L_{wire}$. In addition, the degree of freedom in wiring design is increased by adopting the configuration in which the first conductive film 36 and the second conductive film 37 are connected to each other through the vias 38.

The optical receiver 1 according to the present disclosure is not limited to the embodiment described above. The specific aspects of the optical receiver 1 according to the present disclosure may be changed as appropriate without departing from the scope of the claims.

First Modification Example

Figure 11:
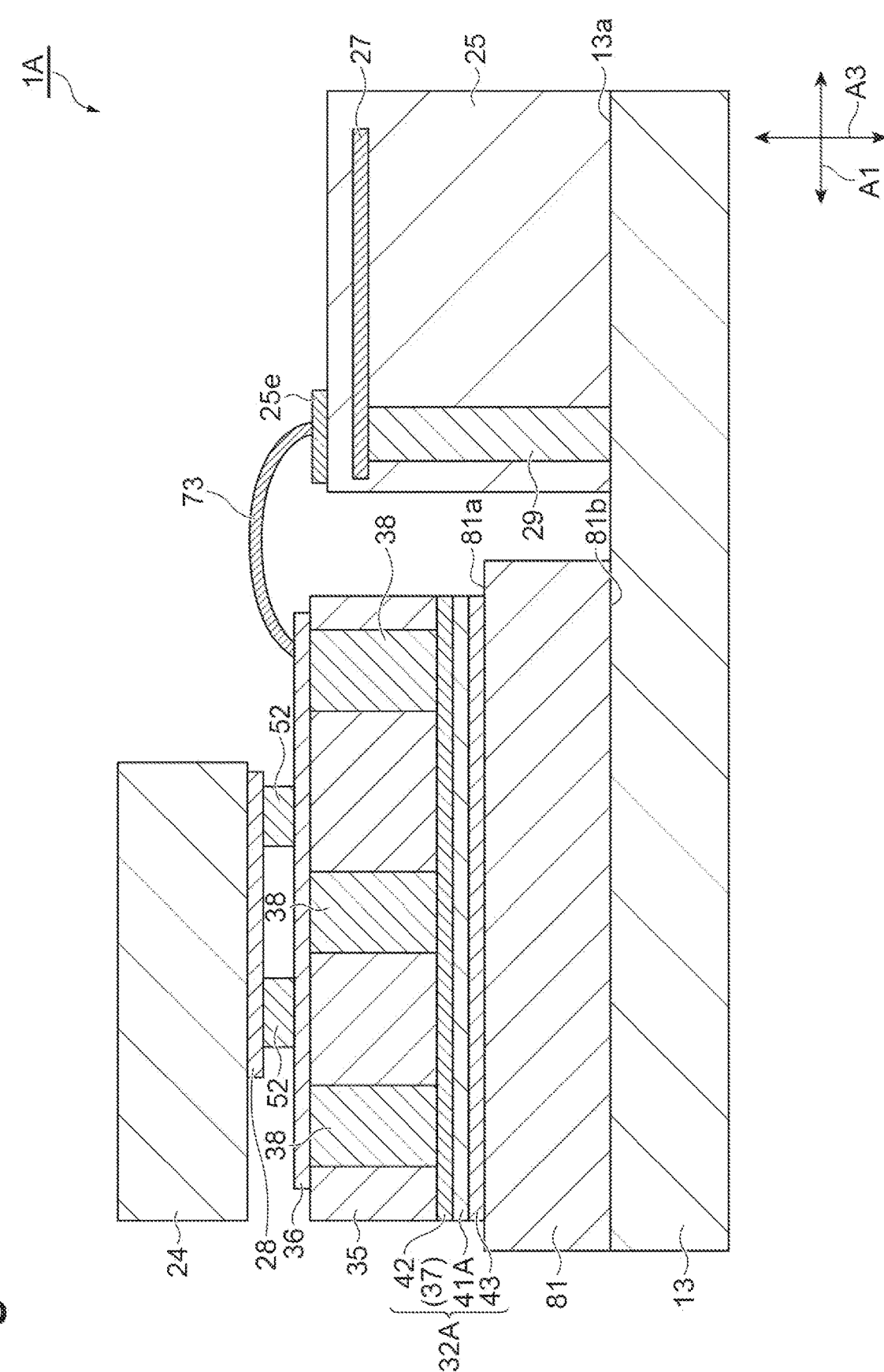
FIG. 11 is a cross-sectional view showing an optical receiver according to a first modification example.

FIG. 11 is a cross-sectional view showing an optical receiver 1A according to a first modification example. In the embodiment described above, the case where the capacitor 32 is a chip capacitor has been exemplified. In the first modification example, a case where a capacitor 32A is an MIM (Metal-Insulator-Metal) capacitor is exemplified. The capacitor 32A has a dielectric layer 41A, a first metal film 42, and a second metal film 43, and has a structure in which the dielectric layer 41A is interposed between the first metal film 42 and the second metal film 43. The dielectric layer 41A is formed thinner than the dielectric layer 41 according to the embodiment described above. For example, the thickness of the dielectric layer 41A may be the same as the thickness of the first metal film 42 or the thickness of the second metal film 43. The dielectric layer 41A is configured as an insulating film that electrically insulates the first metal film 42 and the second metal film 43 from each other. The dielectric layer 41A can be configured to contain, for example, at least one of SiN (silicon nitride), SiO (silicon oxide), and SiON (silicon oxynitride).

In the optical receiver 1A, the capacitor 32A is mounted on the back surface 35b of the carrier substrate 35. In this case, the first metal film 42 of the capacitor 32A is configured integrally with the second conductive film 37 provided on the back surface 35b of the carrier substrate 35. Therefore, when manufacturing the optical receiver 1A, the dielectric layer 41A and the second metal film 43 are formed on the back surface 35b of the carrier substrate 35, and then the carrier substrate 35 on which the dielectric layer 41A and the second metal film 43 are formed is mounted on a metal substrate 81 to be described later. The electrostatic capacitance $C_c$ of the capacitor 32A is sufficiently larger than the parasitic capacitance $C_{cq}$ between the first conductive film 36 and the second conductive film 37. The electrostatic capacitance $C_c$ of the capacitor 32A is 10 pf or more. For example, the electrostatic capacitance $C_c$ of the capacitor 32A may be the same as the electrostatic capacitance of the chip capacitor.

The optical receiver 1A further includes the metal substrate 81 provided between the capacitor 32A and the bottom plate 13. The metal substrate 81 is a substrate formed of a metal material and has electrical conductivity. The metal substrate 81 has a front surface 81*a* conductively bonded to the second metal film 43 of the capacitor 32A and a back surface 81*b* conductively bonded to the bottom surface 13*a* of the bottom plate 13. Therefore, the second metal film 43 is electrically connected to the bottom plate 13 through the metal substrate 81. Depending on the thickness of the metal substrate 81, the height of the capacitor 32A on the metal substrate 81 and the height of the carrier substrate 35 on the capacitor 32A change. Therefore, the thickness of the metal substrate 81 may be set so that the height of the carrier substrate 35 matches the height of the TIA 25.

Even in such a form, the same effect as in the embodiment described above can be obtained. In addition, in the optical receiver 1A, since the capacitor 32A is formed by the first metal film 42, the dielectric layer 41A, and the second metal film 43, it is possible to make the thickness of the capacitor 32A small. Therefore, it is possible to easily realize the capacitor 32A having an electrostatic capacitance larger than the parasitic capacitance $C_{cq}$. The dielectric layer 41A is configured to contain at least one of silicon nitride, silicon oxide, and silicon oxynitride, and insulates the first metal film 42 and the second metal film 43 from each other. Therefore, the dielectric layer 41A can be easily formed, and a desired electrostatic capacitance $C_c$ can be ensured between the first metal film 42 and the second metal film 43.

In addition, in the optical receiver 1A, the metal substrate 81 is provided between the capacitor 32A and the bottom plate 13. Therefore, even if the dielectric layer 41A is formed thin in order to increase the electrostatic capacitance, the heights of the capacitor 32A and the carrier substrate 35 on the metal substrate 81 can be kept large due to the presence of the metal substrate 81. For this reason, the height difference between the carrier substrate 35 and the TIA 25 can be kept small. As a result, it is possible to suppress increases in the lengths of the wires 71, 72, and 73 between the carrier substrate 35 and the TIA 25 and accordingly, to suppress the connection loss between the light receiving element 24 and the TIA 25.

Second Modification Example

Figure 12:
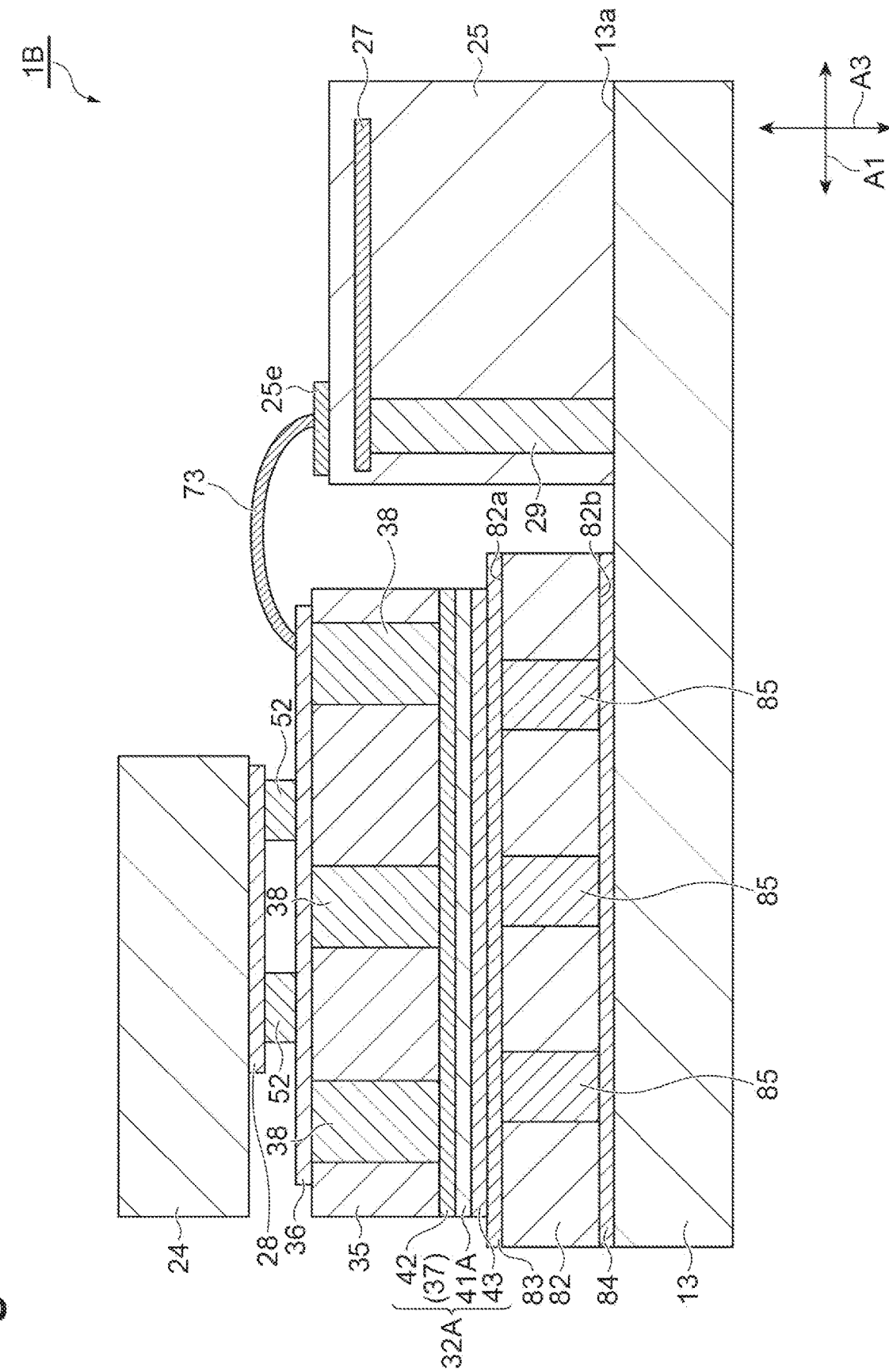
FIG. 12 is a cross-sectional view showing an optical receiver according to a second modification example.

FIG. 12 is a cross-sectional view showing an optical receiver 1B according to a second modification example. The optical receiver 1B has a configuration in which the metal substrate 81 in the optical receiver 1A according to the first modification example is replaced with an insulating substrate 82. That is, the optical receiver 1B includes the capacitor 32A instead of the capacitor 32 and the insulating substrate 82 instead of the metal substrate 81. The insulating substrate 82 is a substrate formed of an insulating material and has an electrical insulation property. The insulating substrate 82 is provided between the capacitor 32A and the bottom plate 13. The insulating substrate 82 has a front surface 82*a* facing the capacitor 32A and a back surface 82*b* facing the bottom plate 13. A front surface metal film 83 conductively bonded to the second metal film 43 of the capacitor 32A is provided on the front surface 82*a*. A back surface metal film 84 conductively bonded to the bottom surface 13*a* of the bottom plate 13 is provided on the back surface 82*b*. The front surface metal film 83 and the back surface metal film 84 are connected to each other by a plurality of vias 85 penetrating the insulating substrate 82 in the direction A3.

Therefore, the front surface metal film 83 and the back surface metal film 84 are electrically connected to each other through the plurality of vias 85. That is, the second metal film 43 of the capacitor 32A is electrically connected to the bottom surface 13*a* of the bottom plate 13 through the front surface metal film 83, the back surface metal film 84, and the plurality of vias 85. Depending on the thickness of the insulating substrate 82, the height of the capacitor 32A on the insulating substrate and the height of the carrier substrate 35 on the capacitor 32A change. Therefore, the thickness of the insulating substrate 82 may be set so that the height of the carrier substrate 35 matches the height of the TIA 25. The configuration for electrically connecting the front surface metal film 83 and the back surface metal film 84 to each other does not need to be a plurality of vias 85, and other configurations may be used as long as the configuration is a conductive film capable of electrically connecting the front surface metal film 83 and the back surface metal film 84 to each other. For example, the front surface metal film 83 and the back surface metal film 84 may be electrically connected to each other by a metal film provided on the side surface of the insulating substrate 82.

Even in such a form, the same effect as in the embodiment described above can be obtained. In addition, in the optical receiver 1B, the insulating substrate 82 is provided between the dielectric layer 41A and the bottom plate 13. For this reason, even if the dielectric layer 41A is formed thin in order to increase the electrostatic capacitance, the heights of the capacitor 32A and the carrier substrate 35 can be kept large due to the presence of the insulating substrate 82. Therefore, the height difference between the carrier substrate 35 and the TIA 25 can be kept small. As a result, it is possible to suppress increases in the lengths of the wires 71, 72, and 73 between the carrier substrate 35 and the TIA 25 and accordingly, to suppress the connection loss between the light receiving element 24 and the TIA 25.

Third Modification Example

Figure 13:
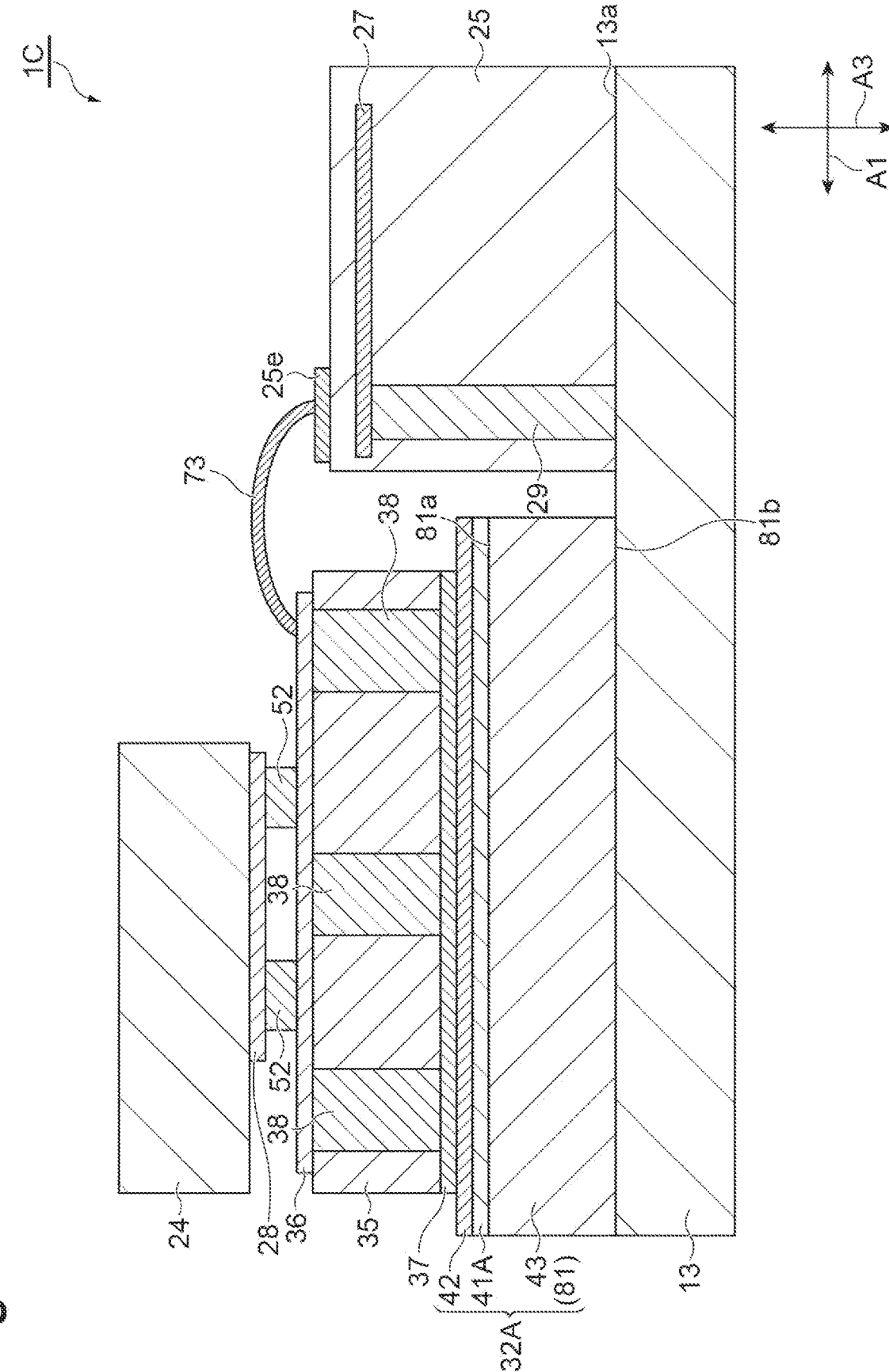
FIG. 13 is a cross-sectional view showing an optical receiver according to a third modification example.

FIG. 13 is a cross-sectional view showing an optical receiver 1C according to a third modification example. The optical receiver 1C includes the capacitor 32A instead of the capacitor 32, similarly to the optical receiver 1A according to the first modification example. However, in the optical receiver 1C, the capacitor 32A is mounted on the metal substrate 81 instead of the back surface 35*b* of the carrier substrate 35. In this case, the second metal film 43 of the capacitor 32A is configured integrally with the metal substrate 81. Therefore, when manufacturing the optical receiver 1C, the dielectric layer 41A and the first metal film 42 are formed on the front surface 81*a* of the metal substrate 81, and then the carrier substrate 35 is mounted on the first metal film 42. Even in such a form, the same effect as in the embodiment described above can be obtained. In addition, in the optical receiver 1C, the process of mounting the capacitor 32A on the substrate 81 can be easily included in the process of metal manufacturing the optical receiver 1C.

Therefore, the process of manufacturing the optical receiver 1C can be suppressed from becoming complicated.

Fourth Modification Example

Figure 14:
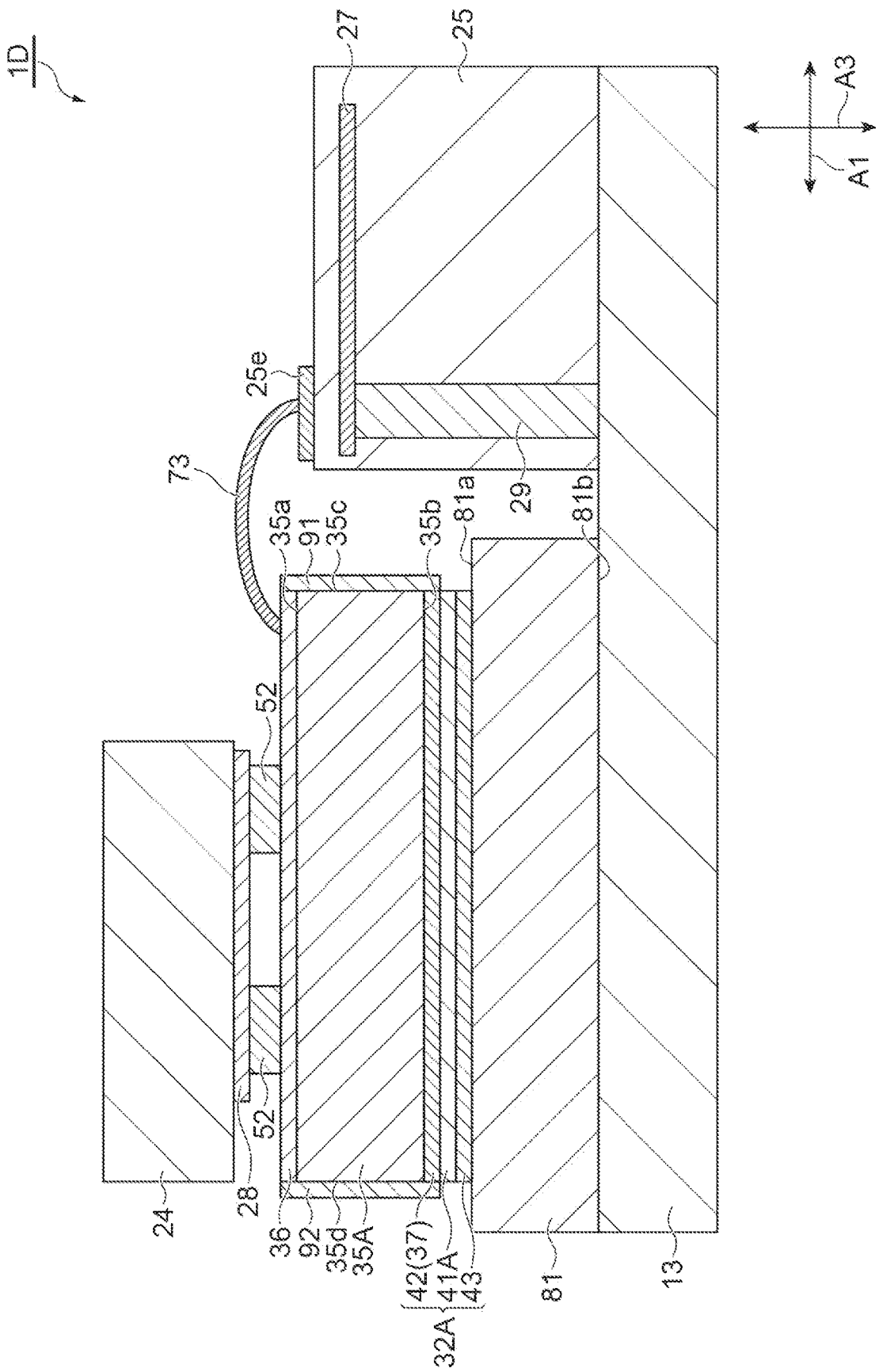
FIG. 14 is a cross-sectional view showing an optical receiver according to a fourth modification example.

FIG. 14 is a cross-sectional view showing an optical receiver 1D according to a fourth modification example. In the embodiment described above, the case where a plurality of vias 38 are formed in the carrier substrate 35 has been exemplified. However, in the optical receiver 1D shown in FIG. 14, a case where a pair of side surface metal films 91 and 92 are formed on the carrier substrate 35A is exemplified. That is, in the optical receiver 1D, the carrier substrate 35A has a pair of side surface metal films 91 and 92 instead of the plurality of vias 38. The pair of side surface metal films 91 and 92 are formed of a metal material and have electrical conductivity.

One side surface metal film 91 is provided on the side surface 35c of the carrier substrate 35A. The side surface metal film 91 extends from the first conductive film 36 to the second conductive film 37 on the side surface 35c and is connected to the first conductive film 36 and the second conductive film 37. The other side surface metal film 92 is provided on the side surface 35d of the carrier substrate 35A. The side surface metal film 92 extends from the first conductive film 36 to the second conductive film 37 on the side surface 35d and is connected to the first conductive film 36 and the second conductive film 37. Therefore, the first conductive film 36 and the second conductive film 37 are electrically connected to each other through the side surface metal films 91 and 92. The side surface metal film 91 may be formed so as to cover the entire surface of side surface 35c, or may be formed so as to cover a part of the side surface 35c. Similarly, the side surface metal film 92 may be formed so as to cover the entire surface of the side surface 35d, or may be formed so as to cover a part of the side surface 35d.

Even in such a form, the same effect as in the embodiment described above can be obtained. In addition, by adopting the configuration in which the first conductive film 36 and the second conductive film 37 are connected to each other by the side surface metal films 91 and 92, it is possible to easily realize a configuration in which the first conductive film 36 and the second conductive film 37 are electrically connected to each other. The side surface metal film may be provided on only one of the side surfaces 35c and 35d of the carrier substrate 35A. The side surface metal film 91 may be configured as a part of the first conductive film 36 or a part of the second conductive film 37. In this case, the first conductive film 36 or the second conductive film 37 may have an extended portion that extends over the side surface 35c, so that the extended portion is configured as the side surface metal film 91. Similarly, the side surface metal film 92 may be configured as a part of the first conductive film 36 or a part of the second conductive film 37. In this case, the first conductive film 36 or the second conductive film 37 may have an extended portion that extends over the side surface 35d, so that the extended portion is configured as the side surface metal film 92.

Fifth Forth Modification Example

Figure 15:
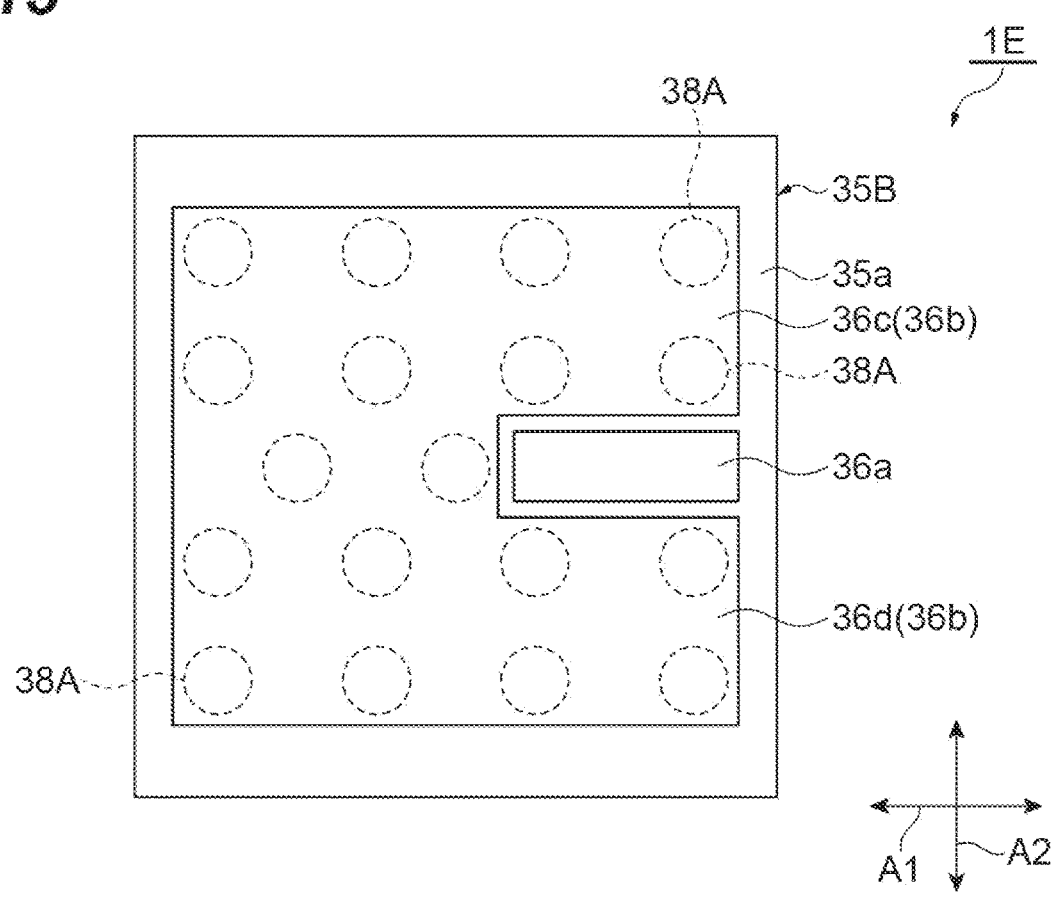
FIG. 15 is a plan view showing a carrier in an optical receiver according to a fifth modification example.
Figure 16:
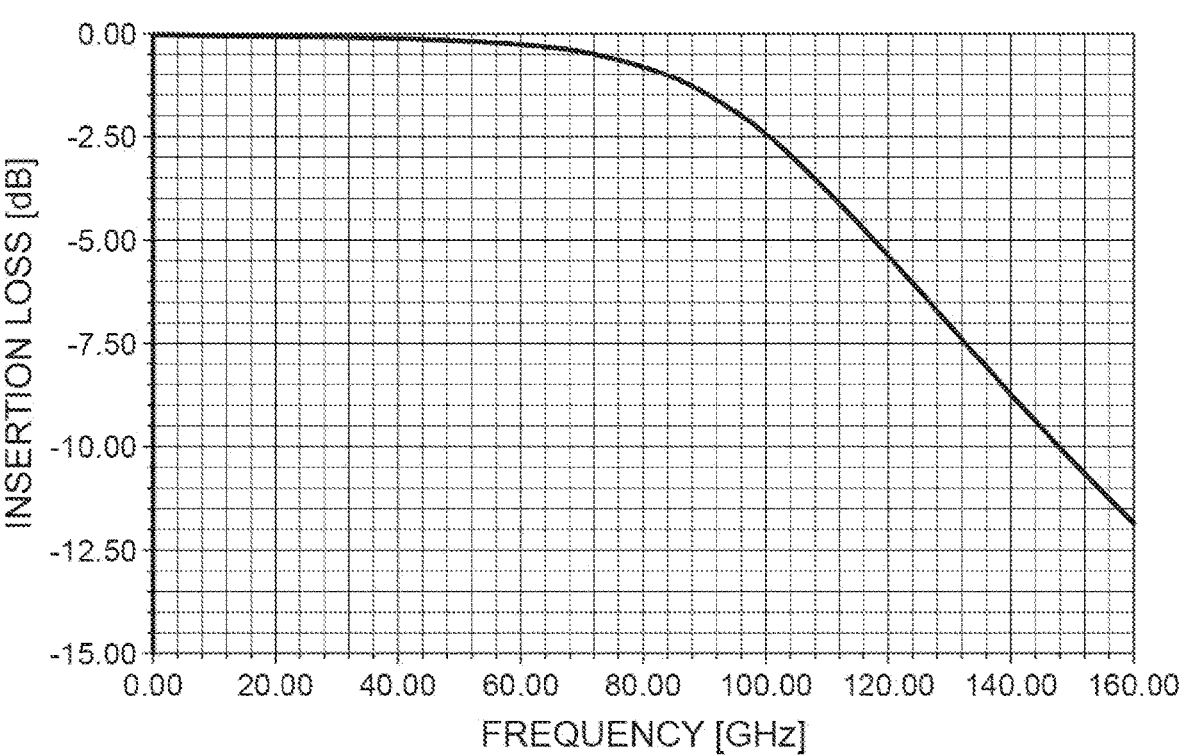
FIG. 16 is a graph showing a simulation result of a relationship between insertion loss and a signal frequency in the optical receiver shown in FIG. 15.

FIG. 15 is a plane view showing an optical receiver 1E according to a fifth modification example. FIG. 16 is a graph showing a simulation result of the relationship between the insertion loss (unit: dB) and the signal frequency (unit: GHz) in the optical receiver 1E shown in FIG. 15. In the optical receiver 1E, a carrier substrate 35B has a larger number of vias 38A than the carrier substrate 35 according to the embodiment described above has. Although 18 vias 38A are shown in FIG. 15, the number of vias 38A is not limited to the example shown in FIG. 15. For example, the number of vias 38A may be another number such as four or eight. The vias 38A are arranged at equal intervals in a region overlapping the cathode wiring pattern 36b in plan view, for example. The vias 38A are arranged symmetrically with respect to the anode wiring pattern 36a in the direction A2, for example.

Even when the number of vias 38A is increased as described above, as shown in FIG. 16, it can be seen that there is no resonance frequency in the high frequency band such as several tens of GHz or 100 GHz. Therefore, even in such a form, the same effect as in the embodiment described above can be obtained. In addition, as described above, it is considered that the resonance frequency of the parasitic capacitance $C_{cq}$ and the inductance $L_{via}$ increases as the number of vias 38A increases. Therefore, by increasing the number of vias 38A, the non-transmission band due to resonance can be more reliably removed from the frequency band of the signal.

The optical receiver according to the present disclosure is not limited to the embodiment and its modification examples described above, and various other modifications can be made. For example, the embodiment and its modification examples described above may be combined with each other according to the desired purpose and effect. The configuration of the optical receiver is not limited to the embodiment and its modification examples described above, and can be changed as appropriate. For example, the first conductive film provided on the carrier may adopt a configuration other than the configuration in which the cathode wiring pattern is provided on both sides of the anode wiring pattern. The plurality of vias do not need to be arranged at equal intervals, and may be arranged at unequal intervals.

REFERENCE SIGNS LIST 1, 1A, 1B, 1C, 1D, 1E: optical receiver, 11: package, 12: sidewall, 12a, 12b: sidewall portion, 13: bottom plate, 13a: bottom surface, 14: bush, 15: optical window, 21: optical axis converter, 21a, 21b: mirror, 22: optical demultiplexer, 23: lens, 24: light receiving element, 24a: front surface, 24b: back surface, 24c: side surface, 25: TIA, 25a: front surface, 25b: back surface, 25c: signal pad, 25d: first bias pad, 25e: second bias pad, 26: feedthrough, 26a: terminal, 27: ground layer, 28: conductive film, 28a: anode pad, 28b: first cathode pad, 28c: second cathode pad, 28d: third cathode pad, 28e: fourth cathode pad, 28f, 28g, 28j, 28k: cathode pattern, 28h: anode pattern, 29: via, 31: carrier, 32, 32A: capacitor, 35, 35A, 35B: carrier substrate, 35a: front surface, 35b: back surface, 35c, 35d: side surface, 36: first conductive film, 36a: anode wiring pattern, 36b: cathode wiring pattern, 36c: first portion, 36d: second portion, 37: second conductive film, 38, 38A: via, 41, 41A: dielectric layer, 41a: front surface, 41b: back surface, 42: first metal film, 43: second metal film, 51, 52: pillar, 71, 72, 73: wire, 81: metal substrate, 81a: front surface, 81b: back surface, 82: insulating substrate, 82a: front surface, 82b: back surface, 83: front surface metal film, 84: back surface metal film, 85: via, 91, 92: side surface metal film, $C_c$: electrostatic capacitance, $C_{cq}$: parasitic capacitance, $L_{via}$, $L_{wire}$: inductance, L: signal light.

What is claimed is:

1. An optical receiver, comprising:

a light receiving element;

a carrier substrate on which the light receiving element is mounted;

a dielectric layer on which the carrier substrate is mounted;

a base which has a conductive main surface at a reference potential and on which the dielectric layer is mounted;

a first conductive film having a first wiring pattern electrically connected to a cathode electrode of the light receiving element and provided between the light receiving element and the carrier substrate;

a second conductive film provided between the carrier substrate and the dielectric layer, a parasitic capacitance being present between the first wiring pattern and the second conductive film;

a conductor provided on the carrier substrate and electrically connected to the first wiring pattern and the second conductive film;

a transimpedance amplifier having a first pad electrically connected to the first wiring pattern through a wire and a second pad electrically connected to an anode electrode of the light receiving element; and an insulating substrate provided between the dielectric layer and the base, wherein an electrostatic capacitance between the second conductive film and the main surface of the base is larger than the parasitic capacitance, an inductance of the conductor is smaller than an inductance of the wire, the insulating substrate has a front surface facing the dielectric layer and a back surface facing the main surface of the base, a back surface metal film electrically connected to the main surface of the base is provided on the back surface of the insulating substrate, and a front surface metal film electrically connected to the back surface metal film through a via penetrating an inside of the insulating substrate is provided on the front surface of the insulating substrate.

2. The optical receiver according to claim 1, wherein the first conductive film further has a second wiring pattern electrically connected to the anode electrode of the light receiving element and a third wiring pattern electrically connected to the cathode electrode of the light receiving element, the first wiring pattern and the third wiring pattern are arranged on both sides of the second wiring pattern, and the conductor is electrically connected to the second conductive film and at least one of the first wiring pattern and the third wiring pattern.

3. The optical receiver according to claim 1, wherein the dielectric layer has a front surface facing the second conductive film and a back surface facing the main surface of the base, a first metal film electrically connected to the second conductive film is provided on the front surface of the dielectric layer, and a second metal film electrically connected to the main surface of the base is provided on the back surface of the dielectric layer.

4. The optical receiver according to claim 3, wherein the dielectric layer contains at least one of silicon nitride, silicon oxide, and silicon oxynitride.

5. The optical receiver according to claim 1, wherein the conductor has a via that extends so as to penetrate the carrier substrate between the first wiring pattern and the second conductive film and that is connected to the first wiring pattern and the second conductive film.

6. The optical receiver according to claim 5, wherein the conductor has a plurality of the vias, and the plurality of vias are arranged at positions spaced apart from each other in plan view of the carrier substrate.

7. The optical receiver according to claim 1, wherein the carrier substrate has a front surface on which the first conductive film is provided, a back surface on which the second conductive film is provided, and a side surface connecting the front surface and the back surface to each other, the conductor has a side surface conductive film provided on the side surface, and the side surface conductive film extends from the first wiring pattern to the second conductive film on the side surface and connects the first wiring pattern and the second conductive film to each other.

8. The optical receiver according to claim 1, further comprising:

a metal substrate provided between the dielectric layer and the base and electrically connected to the main surface of the base.

* * * * *